(12) United States Patent
Jang et al.

(10) Patent No.: US 11,650,460 B2
(45) Date of Patent: May 16, 2023

(54) DISPLAY DEVICE INCLUDING AT LEAST ONE SEALING MEMBER HAVING A STRAIGHT PORTION AND A PROTRUSION PORTION

(71) Applicant: Samsung Display Co., Ltd., Yongin-si (KR)

(72) Inventors: Hwan Young Jang, Hwaseong-si (KR); Na Hyeon Cha, Yongin-si (KR); Sun Kwun Son, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/985,112

(22) Filed: Aug. 4, 2020

(65) Prior Publication Data
US 2021/0048698 A1 Feb. 18, 2021

(30) Foreign Application Priority Data

Aug. 16, 2019 (KR) .......................... 10-2019-0100146

(51) Int. Cl.
| | | |
|---|---|---|
| *G02F 1/1339* | (2006.01) | |
| *H01L 27/12* | (2006.01) | |
| *G02F 1/1679* | (2019.01) | |
| *G02F 1/161* | (2006.01) | |

(52) U.S. Cl.
CPC ............ *G02F 1/1339* (2013.01); *G02F 1/161* (2013.01); *G02F 1/1679* (2019.01); *H01L 27/124* (2013.01)

(58) Field of Classification Search
CPC ............................ G02F 1/1339; G02F 1/1345
See application file for complete search history.

(56) References Cited

U.S. PATENT DOCUMENTS

| | | | |
|---|---|---|---|
| 10,254,580 B2 | 4/2019 | Tae et al. | |
| 10,451,942 B2 | 10/2019 | Yu et al. | |
| 2005/0219456 A1* | 10/2005 | Tadaki ................. | G02F 1/1339 349/156 |
| 2006/0139563 A1* | 6/2006 | Momose ............... | G02F 1/1341 349/190 |

FOREIGN PATENT DOCUMENTS

| | | |
|---|---|---|
| KR | 10-1997-0048807 | 7/1997 |
| KR | 10-0486491 | 8/2006 |
| KR | 10-1641358 | 8/2016 |
| KR | 10-2017-0092726 | 8/2017 |
| KR | 10-2017-0126051 | 11/2017 |

\* cited by examiner

*Primary Examiner* — Lauren Nguyen
(74) *Attorney, Agent, or Firm* — H.C. Park & Associates, PLC

(57) ABSTRACT

According to an aspect of the invention, a display device includes: a first substrate including a display area and a non-display area, a second substrate opposing the first substrate, a liquid crystal layer disposed between the first substrate and the second substrate to overlap the display area, and a seal disposed between the first substrate and the second substrate to surround the liquid crystal layer. At least one corner of the seal projects toward the non-display area.

6 Claims, 22 Drawing Sheets

400 : 410, 420
DL : DL1~DLm
SL : SL1~SLn

DISPLAY DEVICE INCLUDING AT LEAST ONE SEALING MEMBER HAVING A STRAIGHT PORTION AND A PROTRUSION PORTION

CROSS REFERENCE TO RELATED APPLICATION

This application claims priority from and the benefit of Korean Patent Application No. 10-2019-0100146, filed on Aug. 16, 2019, which is hereby incorporated by reference for all purposes as if fully set forth herein.

BACKGROUND

Field

Exemplary implementations of the invention generally relate to a display device and, more particularly, to a display device that minimizes the size of a bezel area.

Discussion of the Background

With the advancement of the information age, demands for display devices for displaying images have been increasing in various forms. For example, the display devices are being applied to various electronic devices such as smart phones, digital cameras, laptop computers, navigation devices, and smart televisions. The display device may be a flat display device such as a liquid crystal display device, a field emission display device, or an organic light-emitting display device.

The liquid crystal display device includes two substrates which are opposite to each other and pixel electrodes, a liquid crystal layer, and common electrodes which are disposed between the two substrates. By using an electric field formed between the pixel electrodes and the common electrodes, the liquid crystal display displays images by determining orientations of liquid crystal molecules in the liquid crystal layer and controlling polarization of incident light. Recently, research and development has been conducted on technology for minimizing a bezel area of a liquid crystal display device.

The above information disclosed in this Background section is only for understanding of the background of the inventive concepts, and, therefore, it may contain information that does not constitute prior art.

SUMMARY

Display devices constructed according to the principles and exemplary implementations of the invention are capable of minimizing the bezel area of a liquid crystal display device. For example, the bezel area may be minimized by providing a seal that concurrently performs the functions of supplying common voltage and sealing the liquid crystal layer as long it is prevented from being connected to the pixel electrodes. The seal may be prevented from being connected to the pixel electrodes in various ways, including changing the shape of the seal, reducing the size of the pixel electrode overlapping the seal and/or providing an insulating member between the pixel electrode and the seal.

Additional features of the inventive concepts will be set forth in the description which follows, and in part will be apparent from the description, or may be learned by practice of the inventive concepts.

According to an aspect of the invention, a display device includes: a first substrate including a display area and a non-display area, a second substrate opposing the first substrate, a liquid crystal layer disposed between the first substrate and the second substrate to overlap the display area, and a seal disposed between the first substrate and the second substrate to surround the liquid crystal layer. At least one corner of the seal projects toward the non-display area.

The seal may include a sealing member having a straight portion disposed substantially parallel to an edge of the display area, and a protrusion portion angled from the straight portion toward the non-display area.

The display device may further include a plurality of pixels disposed on the first substrate, the plurality of pixels comprising pixel electrodes, a distance between the protrusion portion and the pixel electrodes may be greater than a distance between the straight portion and the pixel electrodes.

The display device may further include a plurality of pixels disposed on the first substrate, the plurality of pixels comprising pixel electrodes. The seal may not overlap the pixel electrodes.

The seal may include: a first sealing member disposed at one side edge of the display area, and a second sealing member disposed at the other side edge substantially perpendicular to the one side edge of the display area, each of the first sealing member and the second sealing member includes a substantially straight portion disposed substantially parallel to an edge of the display area and a protrusion portion angled from the substantially straight portion toward the non-display area.

The protrusion portion of the first sealing member may be disposed between the straight portion of the first sealing member and the straight portion of the second sealing member.

The display device may further include a common electrode disposed on the second substrate to face a pixel electrode. The seal may be made of a conductive material and may be in contact with the common electrode.

The display device may further include a common voltage line disposed on at least one edge of the display area on the first substrate. The common voltage line may overlap the sealing member.

According to another aspect of the invention, a display device includes: a first substrate, a plurality of pixels disposed in pixel areas of the first substrate and having pixel electrodes, a second substrate disposed opposing the first substrate, a liquid crystal layer disposed between the first substrate and the second substrate, and a seal disposed between the first substrate and the second substrate to surround the liquid crystal layer. The seal overlaps pixel areas of some pixels of the plurality of pixels and does not overlap the pixel electrodes of the some pixels.

The pixel electrode of the pixel overlapping the seal may have a size smaller than a size of the pixel electrode of the pixel not overlapping the seal.

The seal may include a sealing member having a plurality of substantially straight portions disposed at each of a plurality of edges of the first substrate, and a plurality of round portions disposed between the plurality of substantially straight portions.

The plurality of pixels may include a first pixel overlapping the round portion, and a second pixel not overlapping the round portion, the first pixel may be disposed at a corner of the first substrate.

A difference between a size of the pixel area of the pixel overlapping the seal and a size of the pixel electrode of the pixel overlapping the seal may be determined according to an area of the pixel overlapping the seal.

A difference between a size of the pixel electrode of the pixel overlapping the seal and a size of the pixel electrode of the pixel not overlapping the seal may be based upon an area of the pixel overlapping the seal.

The display device may further include a common electrode disposed on the second substrate to face the pixel electrode. The seal may be made of a conductive material and may be in contact with the common electrode.

According to still another aspect of the invention, a display device includes: a first substrate, a plurality of pixels disposed on the first substrate and comprising pixel electrodes, a second substrate opposing the first substrate, a liquid crystal layer disposed between the first substrate and the second substrate, a seal disposed between the first substrate and the second substrate to surround the liquid crystal layer, and an insulator covering the pixel electrodes of some pixels overlapping the seal.

The seal may include a sealing member having a plurality of substantially straight portions disposed at each of a plurality of edges of the first substrate, and a plurality of round portions disposed between the plurality of substantially straight portions.

The plurality of pixels may include a first pixel overlapping the seal, and a second pixel not overlapping the seal.

The insulator may include an insulating member covering the pixel electrode of the first pixel.

A portion of an upper surface of the insulator may be in contact with the seal, and the other portion of the upper surface of the insulator may be in contact with the liquid crystal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
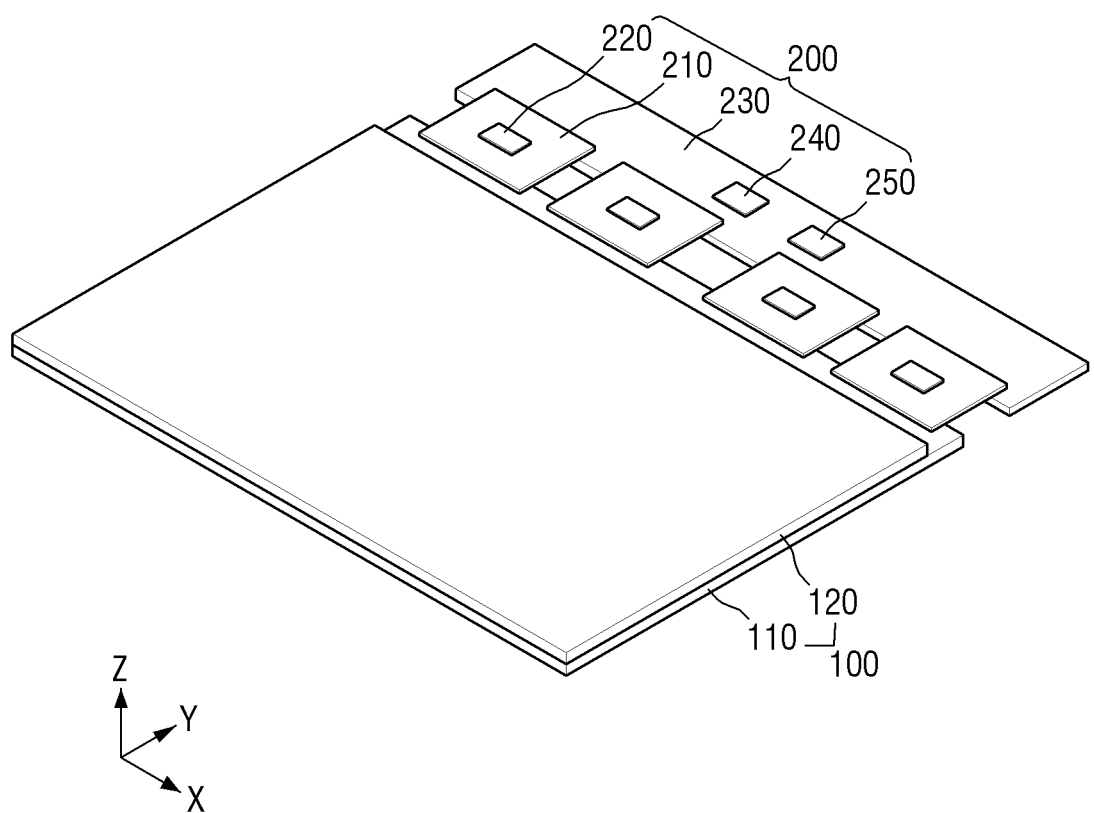
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
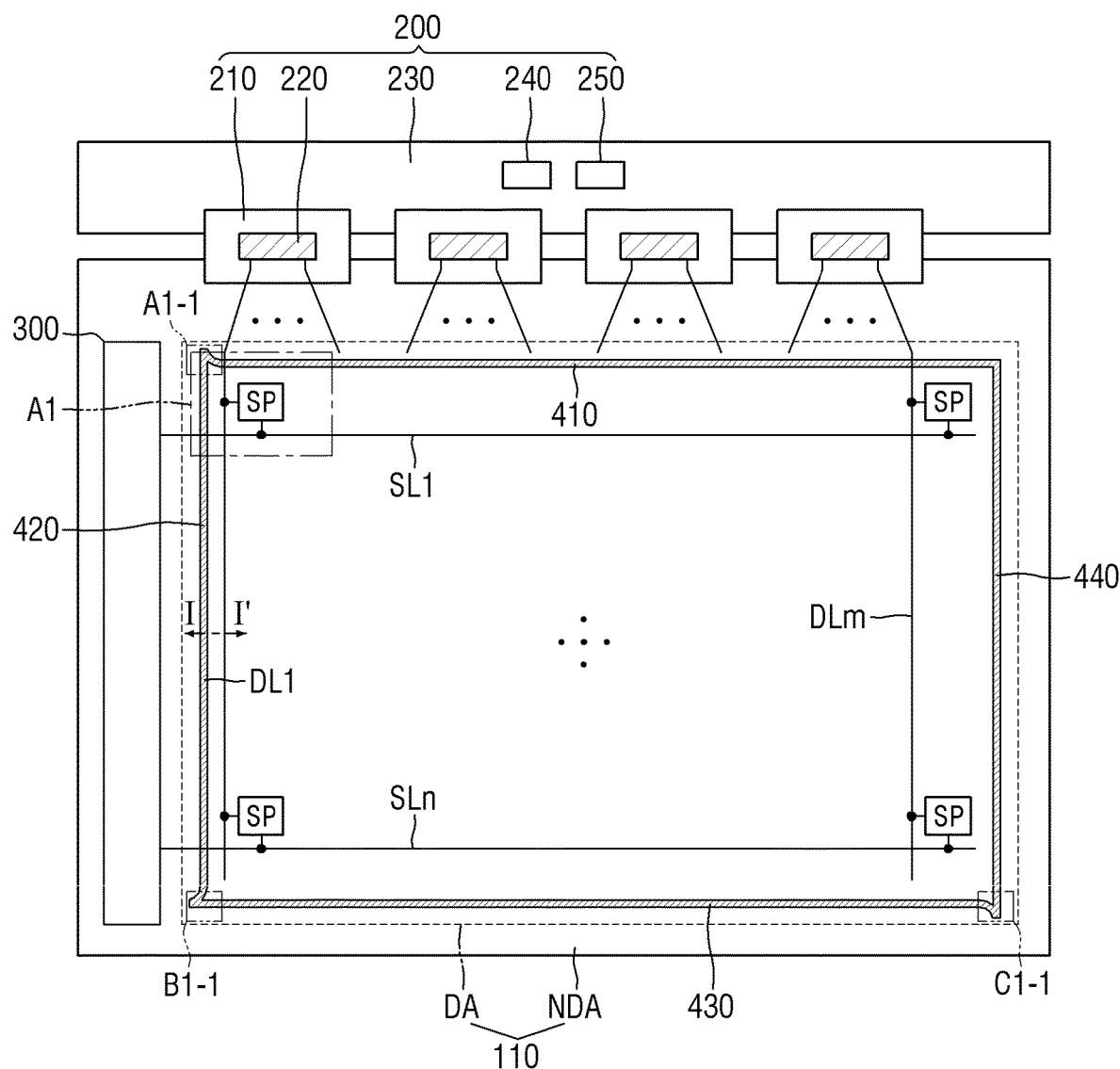
FIG. 2 is a plan view of an exemplary embodiment of the display device constructed according to the principles of the invention.

FIG. 1 is a perspective view of an exemplary embodiment of a display device constructed according to the principles of the invention, and FIG. 2 is a plan view of an exemplary embodiment of the display device according to the principles of the invention.

As used herein, the terms "upper portion," "top," and "upper surface" refer to an upper direction with respect to the display device, that is, a Z-axis direction, and the terms "lower portion," "bottom," and "lower surface" refer to a lower direction with respect to the display device, that is, a direction opposite to the Z-axis direction. In addition, the term "left," "right," "upper," and "lower" refer to directions when the display device is viewed from above. For example, the term "left" refers to a direction opposite to an X-axis direction, the term "right" refers to the X-axis direction, the term "upper" refers to a direction opposite to a Y-axis direction, and the term "lower" refers to a direction opposite to the Y-axis direction.

Referring to FIGS. 1 to 2, the display device is a device which displays a still image or a moving image. The display device may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra mobile PC (UMPC) and may also be used as a display screen for various products such as a television, a laptop computer, a monitor, a billboard, and a device for Internet of things (IoT).

The display device may include a display panel 100 and a display driver 200.

The display panel 100 may have a rectangular shape in a plan view. For example, the plan view of the display panel 100 may have a rectangular shape which has long sides in a first direction (X-axis direction) and short sides in a second direction (Y-axis direction). A corner at which the long side in the first direction (X-axis direction) meets the short side in the second direction (Y-axis direction) may be formed as a right angle or be rounded to have a certain curvature. The shape of the display panel 100 in the plan view is not limited to the rectangular shape but may be formed in another polygonal, a circular, or an elliptical shape. For example, the display panel 100 may be formed to be flat, but exemplary embodiments are not necessarily limited thereto. In another example, the display panel 100 may be formed to be bent with a certain curvature.

The display panel 100 may include a first substrate 110 and a second substrate 120. The first substrate 110 and the second substrate 120 may be made of glass or plastic. For example, the display panel 100 may be implemented as a liquid crystal display panel including a liquid crystal layer disposed between the first substrate 110 and the second substrate 120.

The length of the first substrate 110 in the second direction (Y-axis direction) may be greater than the length of the second substrate 120 in the second direction (Y-axis direction). For example, a portion of an upper surface of the first substrate 110 may not be covered by the second substrate 120 and may be exposed. The exposed upper surface of the first substrate 110 may include pad portions (not shown) to which the display driver 200 is connected.

The first substrate 110 may include a display area DA and a non-display area NDA.

The display area DA may be a area in which an image is displayed and may be defined as a central area of the first substrate 110. The display area DA may include a plurality of pixels SP formed in pixel areas defined by a plurality of data lines DL and a plurality of scan lines SL intersecting each other. Each of the plurality of pixels SP may be connected to at least one scan line SL and at least one data line DL. Each of the plurality of pixels SP may refer to a minimum unit of a area in which light is emitted.

The plurality of data lines DL may include first to $m^{th}$ data lines DL1 to DLm. The first to $m^{th}$ data lines DL1 to DLm may extend in the second direction (Y-axis direction) and may be spaced apart from each other in the first direction (X-axis direction). For example, each of the first to $m^{th}$ data lines DL1 to DLm may be connected to a plurality of pixels SP arranged along each of first to $m^{th}$ columns.

The plurality of scan lines SL may include first to $n^{th}$ scan lines SL1 to SLn. The first to $n^{th}$ scan lines SL1 to SLn may extend in the first direction (X-axis direction) and may be spaced apart from each other in the second direction (Y-axis direction). For example, each of the first to $n^{th}$ scan lines SL1 to SLn may be connected to a plurality of pixels SP arranged along each of first to $n^{th}$ rows.

The non-display area NDA may be defined as the remaining area of the first substrate 110 excluding the display area DA. For example, the non-display area NDA may include a scan driver 300 configured to apply scan signals to the scan lines SL, fan-out lines for connecting the data lines DL and the data driver 220, and the pad portion connected to a flexible film 210.

The display driver 200 may be connected to the pad portion provided in the non-display area NDA of the first substrate 110 and may allow the plurality of pixels to display images based on image data supplied from a display driving system. The display driver 200 may include the flexible film 210, a data driver 220, a circuit board 230, a timing controller 240, and a power supply 250.

Input terminals provided at one side of the flexible film 210 may be attached to the circuit board 230 through a film attaching process, and output terminals provided at the other side of the flexible film 210 may be attached to the pad portions through a film attaching process. For example, the flexible film 210 may be a flexible film such as a tape carrier package or a chip-on-film which is bendable. The flexible film 210 may be bent to a lower portion of the first substrate 110 to reduce a bezel area of the display device.

The data driver 220 may be mounted on the flexible film 210. For example, the data driver 220 may be implemented as an integrated circuit (IC). The data driver 220 may receive digital video data and a data control signal from the timing controller 240 and may convert the digital video data into an analog positive/negative data voltage based on the data control signal to supply the analog positive/negative data voltage to the data lines DL through the fan-out lines.

The circuit board 230 may support the timing controller 240 and the power supply 250 and may transmit power and signals between components of the display driver 200. For example, in order to display an image in each pixel, the circuit board 230 may supply a signal supplied from the timing controller 240 and driving power supplied from the power supply 250 to the data driver 220 and the scan driver 300. To this end, signal transmission lines and a plurality of power lines may be provided on the circuit board 230.

The timing controller 240 may be mounted on the circuit board 230 and may receive image data and a timing synchronization signal supplied from the display driving system through a user connector provided on the circuit board 230. The timing controller 240 may generate digital video data by suitably matching the image data with a pixel arrangement structure on the basis of the timing synchronization signal and may supply the generated digital video data to the data driver 220. The timing controller 240 may generate a data control signal and a scan control signal on the basis of the timing synchronization signal. The timing controller 240 may control a driving timing of the data driver 220 on the basis of the data control signal and may control a driving timing of the scan driver 300 on the basis of the scan control signal.

The power supply 250 may be disposed on the circuit board 230 and may supply a driving voltage to the data driver 220 and the display panel 100. For example, the power supply 250 may generate a first driving voltage to supply the generated first driving voltage to each of the plurality of pixels SP arranged on the first substrate 110 and may generate a second driving voltage to supply the generated second driving voltage to a common electrode disposed on the second substrate 120. The first driving voltage may correspond to a high potential voltage for driving the plurality of pixels SP, and the second driving voltage may correspond to a common voltage commonly supplied to the plurality of pixels SP.

The scan driver 300 may be provided in the non-display area NDA of the first substrate 110. For example, the scan driver 300 may be provided at one side or a left side of the non-display area NDA of the first substrate 110. In another example, the scan driver 300 may be provided at each of two sides or left and right sides of the non-display area NDA of the first substrate 110. The scan driver 300 may generate scan signals according to the scan control signal supplied from the timing controller 240 and may sequentially supply the generated scan signals to a plurality of scan lines in a set order.

A seal may be in the form of a sealing member 400 disposed between the first substrate 110 and the second substrate 120 to surround the liquid crystal layer filling a space between the first substrate 110 and the second substrate 120. The sealing member 400 may be provided along an edge of the display area DA to bond the first substrate 110 and the second substrate 120 to each other. The sealing member 400 may prevent the liquid crystal layer from leaking to the outside of the display area DA by sealing the liquid crystal layer.

The sealing member 400 may include first to fourth sealing members 410 to 440. Referring to FIG. 2, the first sealing member 410 may be disposed along an upper edge of the display area DA. The second sealing member 420 may be disposed along a left edge of the display area DA. The third sealing member 430 may be disposed along a lower edge of the display area DA. The fourth sealing member 440 may be disposed along a right edge of the display area DA.

At least one corner of the sealing member 400 may protrude toward the non-display area NDA. For example, one end (e.g., right side end shown in FIG. 2) of the first sealing member 410 may be disposed parallel to an upper corner of the display area DA. The one end of the first sealing member 410 may connect to one end of the fourth sealing member 440. The other end (e.g., left side end shown in FIG. 2) of the first sealing member 410 may be bent toward an upper side of the non-display area NDA and thus may protrude toward the upper side of the non-display area NDA. The other end of the first sealing member 410 may connect to one end of the second sealing member 420. An angle between the other end of the first sealing member 410 and the one end of the second sealing member 420 may be an acute angle. Therefore, an upper left corner of the sealing member 400 may protrude toward the upper side of the non-display area NDA and thus may not overlap a pixel area in which the pixel SP is disposed. FIG. 2 shows the protruding region A1-1 of the first and second sealing member 410 and 420. The structural relationship between the sealing members 410, 420 and the pixel area is illustrated in detail with FIGS. 3 and 4.

One end (e.g., upper side end shown in FIG. 2) of the second sealing member 420 may be connected to the protruding other end of the first sealing member 410, and the second sealing member 420 may extend along the left edge of the display area DA. The other end (e.g., lower side end shown in FIG. 2) of the second sealing member 420 may protrude toward a left side of the non-display area NDA. The other end of the second sealing member 420 may connect to one end of the third sealing member 430. An angle between the other end of the second sealing member 420 and the one end of the third sealing member 430 may be an acute angle. Therefore, a lower left corner of the sealing member 400 may protrude toward the left side of the non-display area NDA and thus may not overlap a pixel area in which the pixel SP is disposed.

One end (e.g., left side end shown in FIG. 2) of the third sealing member 430 may be connected to the protruding other end of the second sealing member 420, and the third sealing member 430 may extend along the lower edge of the display area DA. The other end (e.g., right side end shown in FIG. 2) of the third sealing member 430 may protrude toward a lower side of the non-display area NDA. FIG. 2 shows the protruding region B1-1 of the second and third sealing member 420 and 430. The other end of the third sealing member 430 may connect to the other end of the fourth sealing member 440. An angle between the other end of the third sealing member 430 and the other end of the fourth sealing member 440 may be an acute angle. Therefore, a lower right corner of the sealing member 400 may protrude toward the lower side of the non-display area NDA and thus may not overlap a pixel area in which the pixel SP is disposed.

The other end (e.g., lower side end shown in FIG. 2) of the fourth sealing member 440 may be connected to the protruding other end of the third sealing member 430, and the fourth sealing member 440 may extend along the right edge of the display area DA. FIG. 2 shows the protruding region C1-1 of the third and fourth sealing member 430 and 440. The one end (e.g., upper side end shown in FIG. 2) of the fourth sealing member 440 may be connected to one end of the first sealing member 410, and an angle between the one end of the fourth sealing member 440 and the one end of the first sealing member 410 may be a right angle. Therefore, an upper right corner of the sealing member 400 may not overlap a pixel area in which the pixel SP is disposed.

The sealing member 400 may be made of a conductive material and may electrically connect a common voltage line disposed on the first substrate 110 and the common electrode disposed on the second substrate 120. Accordingly, since the sealing member 400 concurrently performs the function of supplying the common voltage supplied from the first substrate 110 to the common electrode of the second substrate 120 and the function of sealing the liquid crystal layer, it is possible to omit a separate component disposed in the bezel area of the display device, thereby minimizing the bezel area. Since the sealing member 400 does not overlap the pixel area in which the pixel SP is disposed, the sealing member 400 may not be connected to a pixel electrode of the pixel SP. Accordingly, in the display device according to the illustrated exemplary embodiment, the sealing member 400 through which the common voltage flows may be prevented from being connected to the pixel electrode of the pixel SP, thereby preventing the common voltage from being supplied to the pixel electrode while minimizing the size of the bezel area of the display device.

The sealing member 400 may be formed at the edge of the display area DA through a single process using an injection member. For example, a conductive sealing material may be injected between the first substrate 110 and the second substrate 120 through a single process using a syringe. Therefore, in the display device according to the exemplary embodiment, it is possible to shorten the process of forming the sealing member 400, prevent disconnection of the sealing member 400, and also prevent the sealing member 400 from being connected to the pixel electrode.

Figure 3:
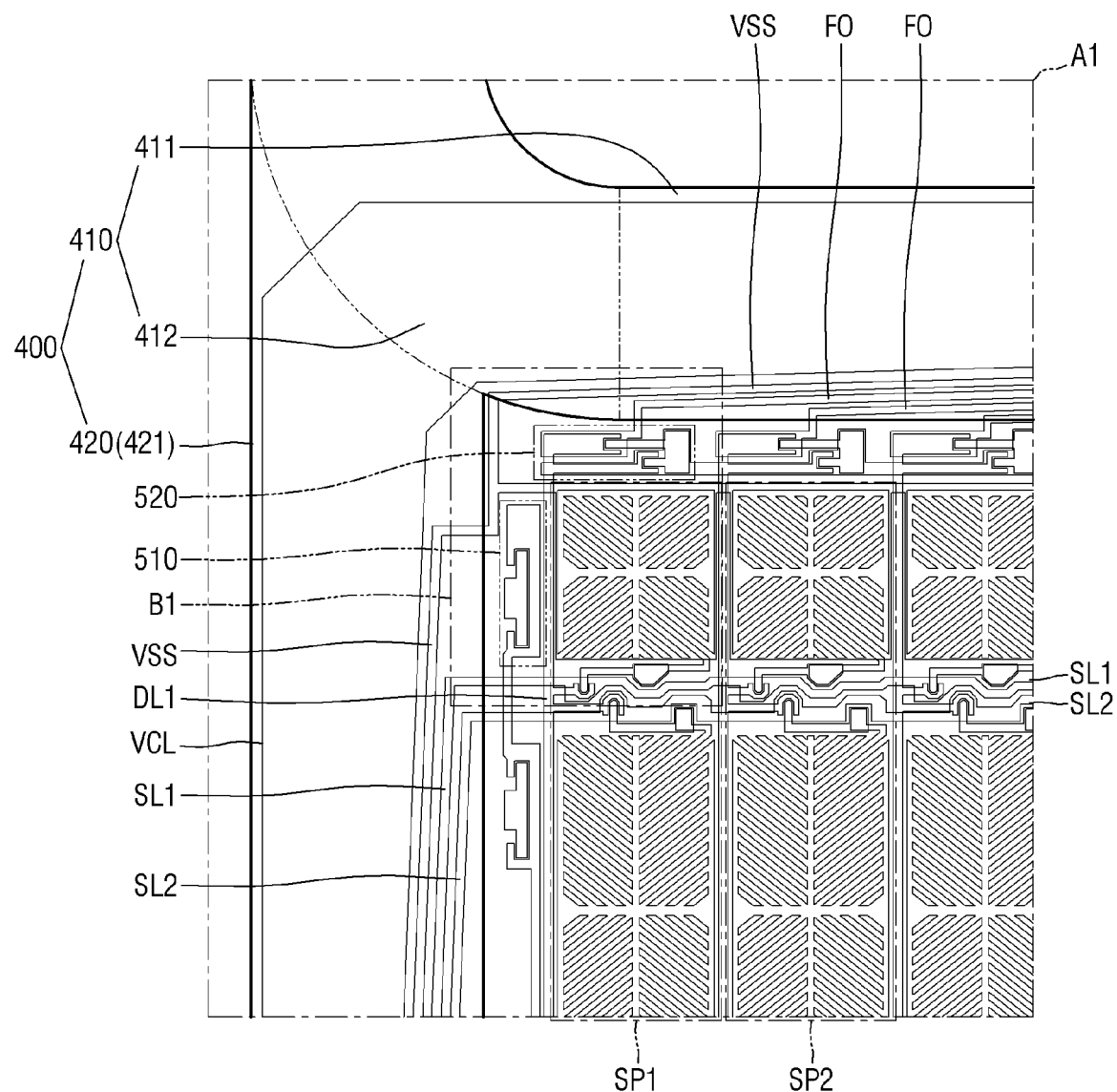
FIG. 3 is an enlarged view of a specific area A1 of FIG. 2.
Figure 4:
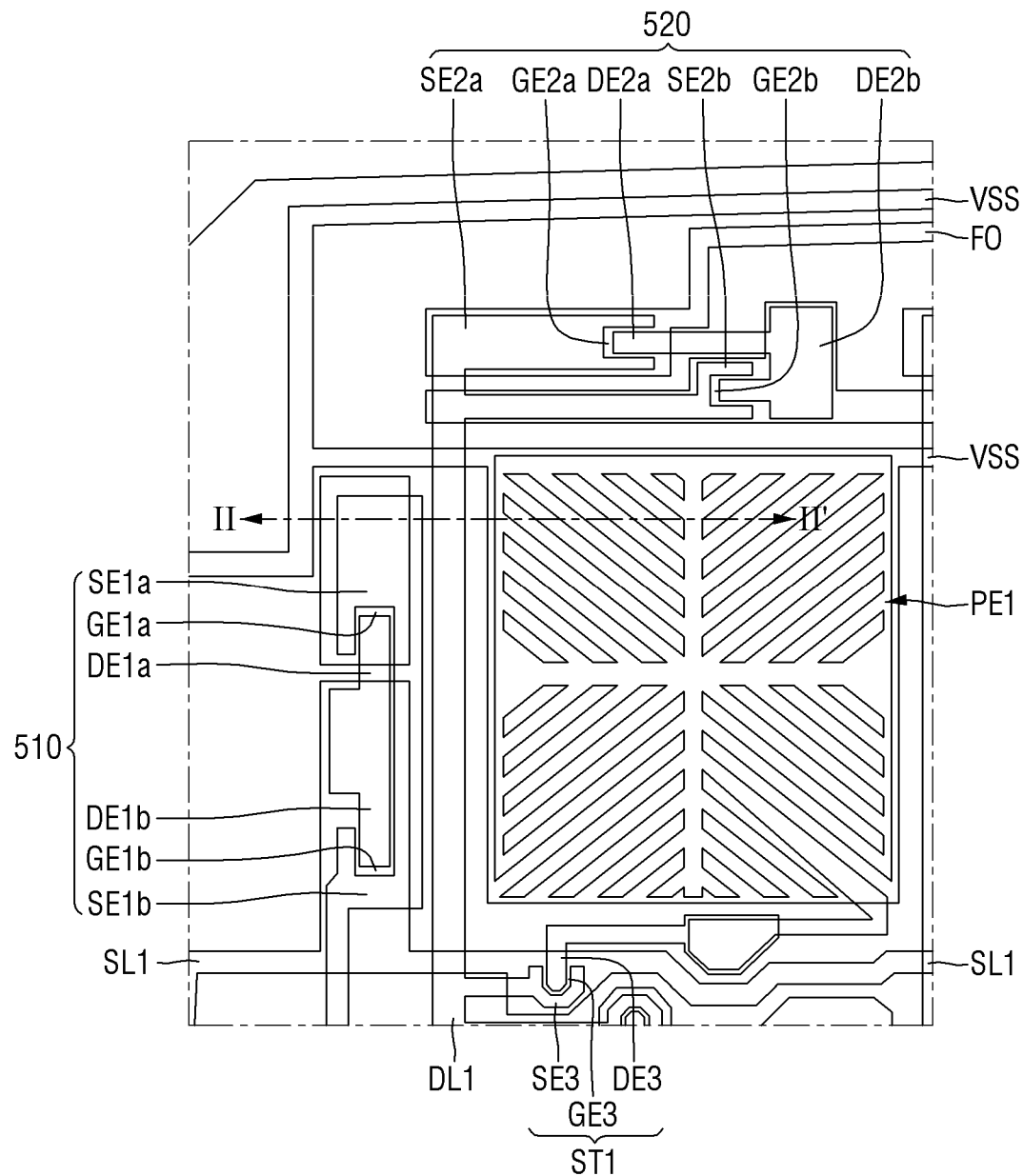
FIG. 4 is an enlarged view of a specific area B1 of FIG. 3.

FIG. 3 is an enlarged view of a specific area A1 of FIG. 2, and FIG. 4 is an enlarged view of a specific area B1 of FIG. 3.

Referring to FIGS. 3 and 4, the display device may further include a common voltage line VCL, a ground line VSS, a first electrostatic discharge protection element 510, and a second electrostatic discharge protection element 520.

The common voltage line VCL may be disposed along the edge of the display area DA of the first substrate 110. The common voltage line VCL may be disposed to overlap the sealing member 400 and may be connected to the sealing member 400 through a connection electrode CNE shown in FIG. 12. For example, the common voltage line VCL may receive the common voltage from the power supply 250 or the display driver 200. The common voltage may be supplied to the connection electrode and the sealing member 400 sequentially disposed on the common voltage line VCL. The sealing member 400 made of the conductive material may supply the common voltage to the common electrode disposed on the second substrate 120, and thus, the display device may not include a separate component for transmitting the common voltage other than the sealing member 400. Therefore, it is possible to minimize the bezel area of the display device.

The ground line VSS may be connected to a ground electrode of a storage capacitor of each of the plurality of pixels SP. For example, the ground electrode of the storage capacitor of each of the plurality of pixels SP may be formed as a common electrode, but exemplary embodiments are not necessarily limited thereto. The ground line VSS may extend from the ground electrode of the storage capacitor along the edge of the display area DA and may be connected to a ground portion of the first substrate 110.

The first electrostatic discharge protection element 510 may include a plurality of first electrostatic discharge protection elements 510 disposed along the left edge of the display area DA. Each of the plurality of first electrostatic discharge protection elements 510 may be surrounded by at least some of the scan line SL, the ground line VSS, the ground electrode of the pixel SP, and the first data line DL1. For example, each of the plurality of first electrostatic discharge protection elements 510 may correspond to one of the plurality of scan lines SL, but exemplary embodiments are not necessarily limited thereto. One first electrostatic discharge protection element 510 may prevent static electricity from being generated between the first scan line SL1 and the ground line VSS. In addition, the first electrostatic discharge protection element 510 may prevent static electricity from being generated between the first scan line SL1, the ground line VSS, a ground electrode of a first pixel SP1, and the first data line DL1.

The other first electrostatic discharge protection element 510 may prevent static electricity from being generated between the second scan line SL2 and the ground line VSS. In addition, the first electrostatic discharge protection element 510 may prevent static electricity from being generated between the second scan line SL1, the ground line VSS, the ground electrode of the first pixel SP1, and the first data line DL1.

In another example, each of the plurality of first electrostatic discharge protection elements 510 may correspond to one of the plurality of pixels SP adjacent to the left edge of the display area DA. The design of the number and configuration of the plurality of first electrostatic discharge protection elements 510 may be appropriately changed according to the configuration of a plurality of lines and a plurality of electrodes arranged on the first substrate 110.

Referring to FIG. 4, the first electrostatic discharge protection element 510 may include a first transistor including a first source electrode SE1a, a first gate electrode GE1a, and a first drain electrode DE1a and a second transistor including a second source electrode SE1b, a second gate electrode GE1b, and a second drain electrode DE1b. The first transistor denoted by SE1a, GE1a, and DE1a and the second transistor denoted by SE1b, GE1b, and DE1b of the first electrostatic discharge protection element 510 may be vertically arranged at the left edge of the display area DA. For example, the first drain electrode DE1a and the second drain electrode DE1b of the first electrostatic discharge protection element 510 may share the same electrode.

The second electrostatic discharge protection element 520 may be provided as a plurality of second electrostatic discharge protection elements 520 disposed along the upper edge of the display area DA. Each of the plurality of second electrostatic discharge protection elements 520 may be surrounded by at least some of a fan-out line FO, the ground line VSS, the ground electrode of the pixel SP, and the data line DL. For example, each of the plurality of second electrostatic discharge protection elements 520 may correspond to one of a plurality of fan-out lines FO, but exemplary embodiments are not necessarily limited thereto. One second electrostatic discharge protection element 520 may prevent static electricity from being generated between the fan-out FO and the ground line VSS. In addition, the second electrostatic discharge protection element 520 may prevent static electricity from being generated between the fan-out line FO, the ground line VSS, the ground electrode of the first pixel SP1, and the first data line DL1.

In addition, the other second electrostatic discharge protection element 520 may prevent static electricity from being generated between the fan-out line FO, the ground line VSS, a ground electrode of a second pixel SP2, and the first data line DL1.

In another example, each of the plurality of second electrostatic discharge protection elements 520 may correspond to one of a plurality of pixels SP adjacent to the upper edge of the display area DA. The design of the number and configuration of the plurality of second electrostatic discharge protection elements 520 may be appropriately changed according to the configuration of a plurality of lines and a plurality of electrodes arranged on the first substrate 110.

Referring to FIG. 4, the second electrostatic discharge protection element 520 may include a first transistor including a first source electrode SE2a, a first gate electrode GE2a, and a first drain electrode DE2a and a second transistor including a second source electrode SE2b, a second gate electrode GE2b, and a second drain electrode DE2b. The first transistor denoted by SE2a, GE2a, and DE2a and the second transistor denoted by SE2b, GE2b, and DE2b of the second electrostatic discharge protection element 520 may be vertically arranged at the upper edge of the display area DA. For example, the first drain electrode DE2a and the second drain electrode DE2b of the second electrostatic discharge protection element 520 may share the same electrode.

As illustrated in FIG. 2, the sealing member 400 may include the first to fourth sealing members 410 to 440. The first sealing member 410 may be disposed along the upper edge of the display area DA. The second sealing member 420 may be disposed along the left edge of the display area DA. The third sealing member 430 may be disposed along the lower edge of the display area DA. The fourth sealing member 440 may be disposed along the right edge of the display area DA.

Referring to FIG. 3, the first sealing member 410 may include a straight portion 411 and a protrusion portion 412. The straight portion 411 of the first sealing member 410 may be connected to the fourth sealing member 440 and may extend along the upper edge of the display area DA. The protrusion portion 412 of the first sealing member 410 may be angled (e.g., bent) upwardly toward the upper side of the non-display area NDA from the straight portion 411. The protrusion portion 412 of the first sealing member 410 may be farther from the pixel area of the pixel SP than the straight portion 411. For example, a distance d2 shown in FIG. 7 between the protrusion portion 412 of the first sealing member 410 and the first pixel SP1 may be greater than a distance d1 shown in FIG. 7 between the straight portion 411 and the second pixel SP2. Therefore, the upper left corner of the sealing member 400 may protrude toward the upper side of the non-display area NDA and thus may not overlap the pixel area in which the pixel SP is disposed and may not be connected to the pixel electrode of the pixel SP.

For example, the first sealing member 410 may be formed through a drawing process using a syringe. The straight portion 411 of the first sealing member 410 may be formed by drawing a syringe along a straight line, and the protrusion portion 412 may be formed by drawing a syringe along a curved line toward the non-display area NDA. The process of forming a straight portion 421 of the second sealing member 420 may be performed subsequently to the process of forming the protrusion portion 412 of the first sealing member 410. Processes of forming the third and fourth sealing members 430 and 440 may also be performed subsequently to the process of forming the second sealing member 420. Therefore, the sealing member 400 may be formed at the edge of the display area DA through a single process.

Referring to FIG. 3, the second sealing member 420 may include the straight portion 421 and a protrusion portion. The protrusion portion of the second sealing member 420 may extend from the straight portion 421 of the second sealing member 420, and may be connected to the protrusion portion 412 of the first sealing member 410, thus may extend along the left edge of the display area DA. Therefore, the upper left corner of the sealing member 400 at which the second sealing member 420 is connected to the first sealing member 410 may protrude toward the upper side of the non-display area NDA and thus may not overlap the pixel area in which the pixel SP is disposed and may not be connected to the pixel electrode of the pixel SP.

The sealing member 400 may surround the edge of the display area DA so as to not overlap the plurality of pixels SP. The sealing member 400 may be disposed to overlap the common voltage line VCL, thereby minimizing the bezel area of the display device. For example, the sealing member 400 may overlap the fan-out line FO and the scan line SL provided along the edge of the display area DA, but exemplary embodiments are not necessarily limited thereto. For example, the sealing member 400 may not overlap the plurality of first electrostatic discharge protection elements 510 and the plurality of second electrostatic discharge protection elements 520, but exemplary embodiments are not necessarily limited thereto. Therefore, the sealing member 400 may overlap the common voltage line VCL and may not overlap the plurality of pixels SP, thereby preventing the common voltage from being supplied to the pixel electrode while minimizing the size of the bezel area.

Figure 5:
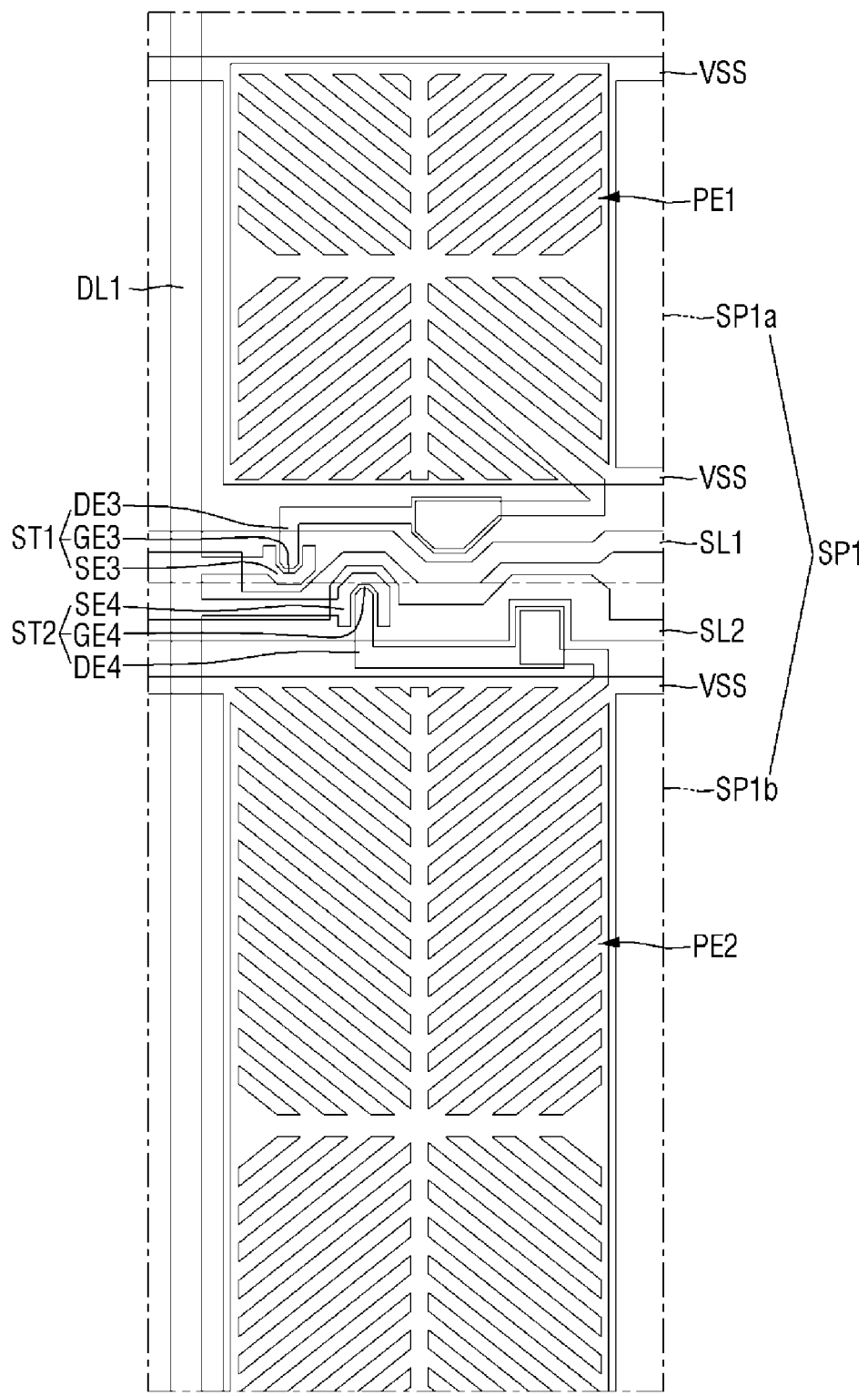
FIG. 5 is a plan view of an exemplary embodiment of a representative pixel of the display device of FIG. 2
Figure 6:
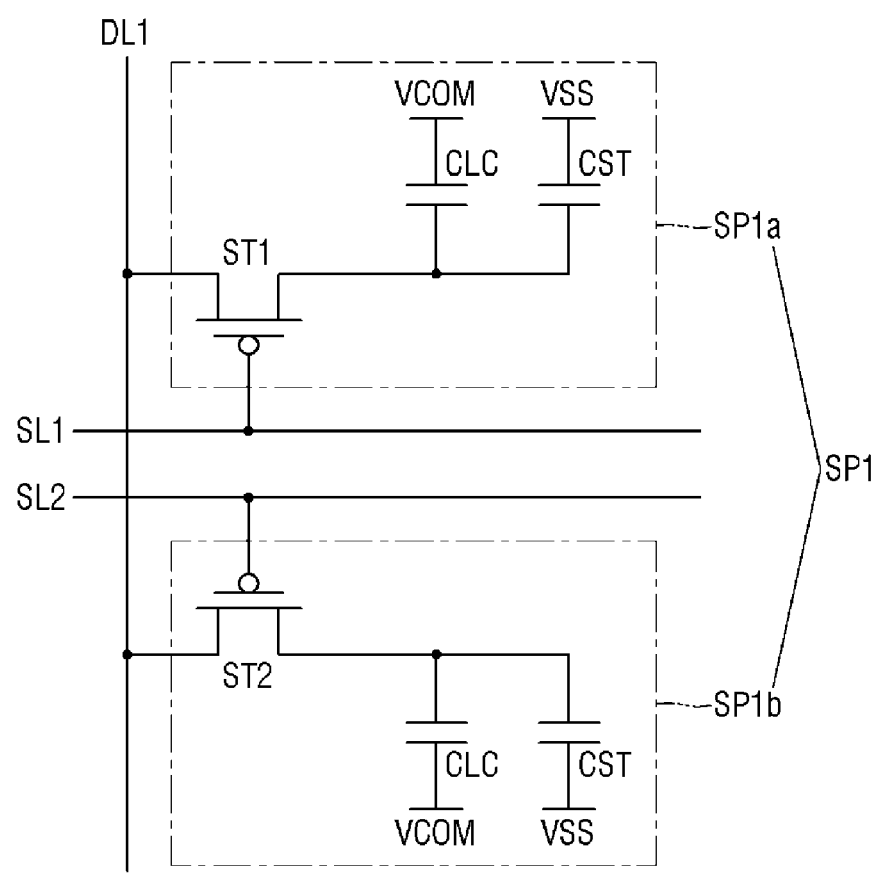
FIG. 6 is a circuit diagram of an exemplary embodiment of the representative pixel of the display device of FIG. 2.

FIG. 5 is a plan view of an exemplary embodiment of a representative pixel of the display device of FIG. 2, and FIG. 6 is a circuit diagram of an exemplary embodiment of the representative pixel of the display device of FIG. 2.

Referring to FIGS. 5 and 6, the first pixel SP1 may include a first subpixel SP1a and a second subpixel SP1b.

The first subpixel SP1a may include a first switching transistor ST1 and a first pixel electrode PE1. The first subpixel SP1a may further include a liquid crystal capacitor CLC, which is formed of the first pixel electrode PE1 and the common electrode on the second substrate 120, and a storage capacitor CST formed of the first pixel electrode PE1 and the ground electrode.

The first switching transistor ST1 may be connected to the first scan line SL1 and the first data line DL1. The first switching transistor ST1 may be turned on based on a scan signal to supply a data voltage to the first pixel electrode PE1. For example, the first switching transistor ST1 may include a gate electrode GE3 connected to the first scan line SL1, a source electrode SE3 connected to the first data line DL1, and a drain electrode DE3 connected to the first pixel electrode PE1.

One end of the liquid crystal capacitor CLC may be formed of the first pixel electrode PE1, and the other end of the liquid crystal capacitor CLC may be formed of the common electrode on the second substrate 120. The first pixel electrode PE1 may receive a data voltage, and the common electrode may receive a common voltage VCOM. The liquid crystal capacitor CLC may be charged with a voltage corresponding to a voltage difference between the first pixel electrode PE1 and the common electrode. The liquid crystal layer may be disposed between the first pixel electrode PE1 and the common electrode, and an orientation of the liquid crystal layer may be changed according to the voltage difference between the first pixel electrode PE1 and the common electrode, thereby changing transmittance of light passing through the liquid crystal layer.

One end of the storage capacitor CST may be formed of the first pixel electrode PE1, and the other end of the storage capacitor CST may be formed of the ground electrode. The first pixel electrode PE1 may receive a data voltage, and the ground electrode may correspond to an electrode extending from the ground line VSS. The ground line VSS may be grounded through the ground portion of the first substrate 110. For example, the ground electrode may be formed integrally with the ground line VSS, but exemplary embodiments are not necessarily limited thereto. The storage capacitor CST may be charged with a voltage corresponding to a voltage difference between the first pixel electrode PE1 and the ground electrode.

For example, when the first scan line SL1 receives a gate-on voltage, the first switching transistor ST1 may be turned on, and the first data line DL1 may supply a data voltage to the first pixel electrode PE1. The storage capacitor CST may be charged with the data voltage and may supply the charged voltage to the liquid crystal capacitor CLC during one frame period. Accordingly, the liquid crystal capacitor CLC may maintain a certain potential difference due to the storage capacitor CST, and the liquid crystal layer may transmit light by maintaining a certain orientation state.

The second subpixel SP1b may include a second switching transistor ST2 and a second pixel electrode PE2. The second subpixel SP1b may further include a liquid crystal capacitor CLC formed of the second pixel electrode PE2 and the common electrode on the second substrate 120, and a storage capacitor CST formed of the second pixel electrode PE2 and the ground electrode.

The second switching transistor ST2 may be connected to the second scan line SL2 and the first data line DL1. The second switching transistor ST2 may be turned on based on a scan signal to supply a data voltage to the second pixel electrode PE2. For example, the second switching transistor ST2 may include a gate electrode GE4 connected to the second scan line SL2, a source electrode SE4 connected to the first data line DL1, and a drain electrode DE4 connected to the second pixel electrode PE2.

One end of the liquid crystal capacitor CLC may be formed of the second electrode PE2, and the other end of the liquid crystal capacitor CLC may be formed of the common electrode on the second substrate 120. For example, the common electrode of the first subpixel SP1a and the common electrode of the second subpixel SP1b may share the same electrode. The liquid crystal capacitor CLC may be charged with a voltage corresponding to a voltage difference between the second pixel electrode PE2 and the common electrode. The liquid crystal layer may be disposed between the second pixel electrode PE2 and the common electrode, and an orientation of the liquid crystal layer may be changed according to the voltage difference between the second pixel electrode PE2 and the common electrode, thereby changing transmittance of light passing through the liquid crystal layer.

One end of the storage capacitor CST may be formed of the second pixel electrode PE2, and the other end of the storage capacitor CST may be formed of the ground electrode. The ground electrode may correspond to an electrode extending from the ground line VSS. For example, the ground electrode of the first subpixel SP1a and the ground electrode of the second subpixel SP1b may share the same electrode. The storage capacitor CST may be charged with a voltage corresponding to a voltage difference between the second pixel electrode PE2 and the ground electrode.

For example, when the second scan line SL2 receives a gate-on voltage, the second switching transistor ST2 may be turned on, and the first data line DL1 may supply a data voltage to the second pixel electrode PE2. The storage capacitor CST may be charged with the data voltage and may supply the charged voltage to the liquid crystal capacitor CLC during one frame period. Accordingly, the liquid crystal capacitor CLC may maintain a certain potential difference by the storage capacitor CST, and the liquid crystal layer may transmit light by maintaining a certain orientation state.

Figure 7:
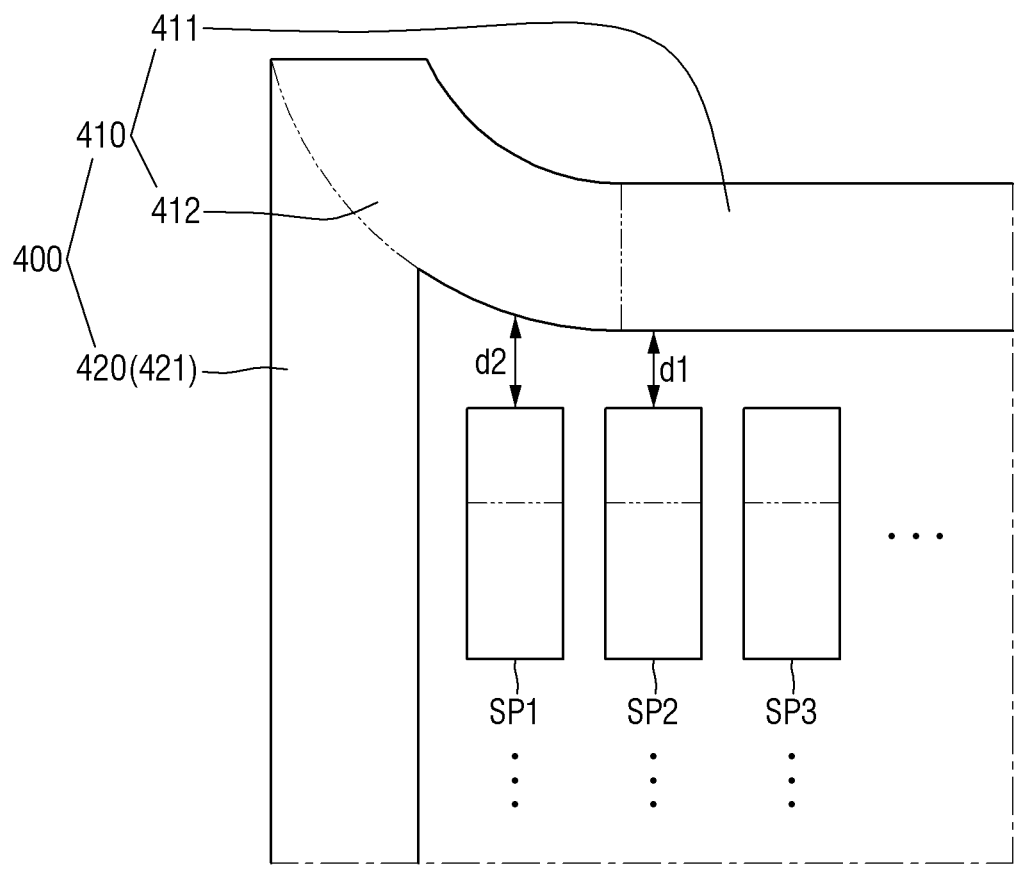
FIG. 7 is a view of an exemplary embodiment of the positional relationship between a sealing member and pixels of the display device of FIG. 2.

FIG. 7 is a view of an exemplary embodiment of the positional relationship between the sealing member and the pixels of the display device of FIG. 2.

Referring to FIGS. 2 and 7, the sealing member 400 may include the first to fourth sealing members 410 to 440. The first sealing member 410 may be disposed along the upper edge of the display area DA. The second sealing member 420 may be disposed along the left edge of the display area DA. The third sealing member 430 may be disposed along the lower edge of the display area DA. The fourth sealing member 440 may be disposed along the right edge of the display area DA.

The first sealing member 410 may include the straight portion 411 and the protrusion portion 412. The straight portion 411 of the first sealing member 410 may be connected to the fourth sealing member 440 and may extend along the upper edge of the display area DA. The protrusion portion 412 of the first sealing member 410 may be angled toward the upper side of the non-display area NDA from the straight portion 411. For example, the protrusion portion 412 of the first sealing member 410 may be disposed between the straight portion 411 of the first sealing member 410 and the straight portion 421 of the second sealing member 420. The protrusion portion 412 of the first sealing member 410 may be farther from the pixel area of the pixel SP than the straight portion 411. For example, the distance d2 between the protrusion portion 412 of the first sealing member 410 and the first pixel SP1 may be greater than the distance between the straight portion 411 and the second pixel SP2. Therefore, the upper left corner of the sealing member 400 may protrude toward the upper side of the non-display area NDA and thus may not overlap the pixel area in which the pixel SP is disposed and may not be connected to the pixel electrode of the pixel SP.

FIGS. 8, 9, 10, and 11 are views illustrating exemplary processes of forming the sealing member of the display device of FIG. 2.

Referring to FIGS. 8 to 11, the sealing member 400 may be formed at the edge of the display area DA through a single process using an injection member. For example, a conductive sealing material may be injected between the first substrate 110 and the second substrate 120 through a single process using a syringe.

Figure 8:
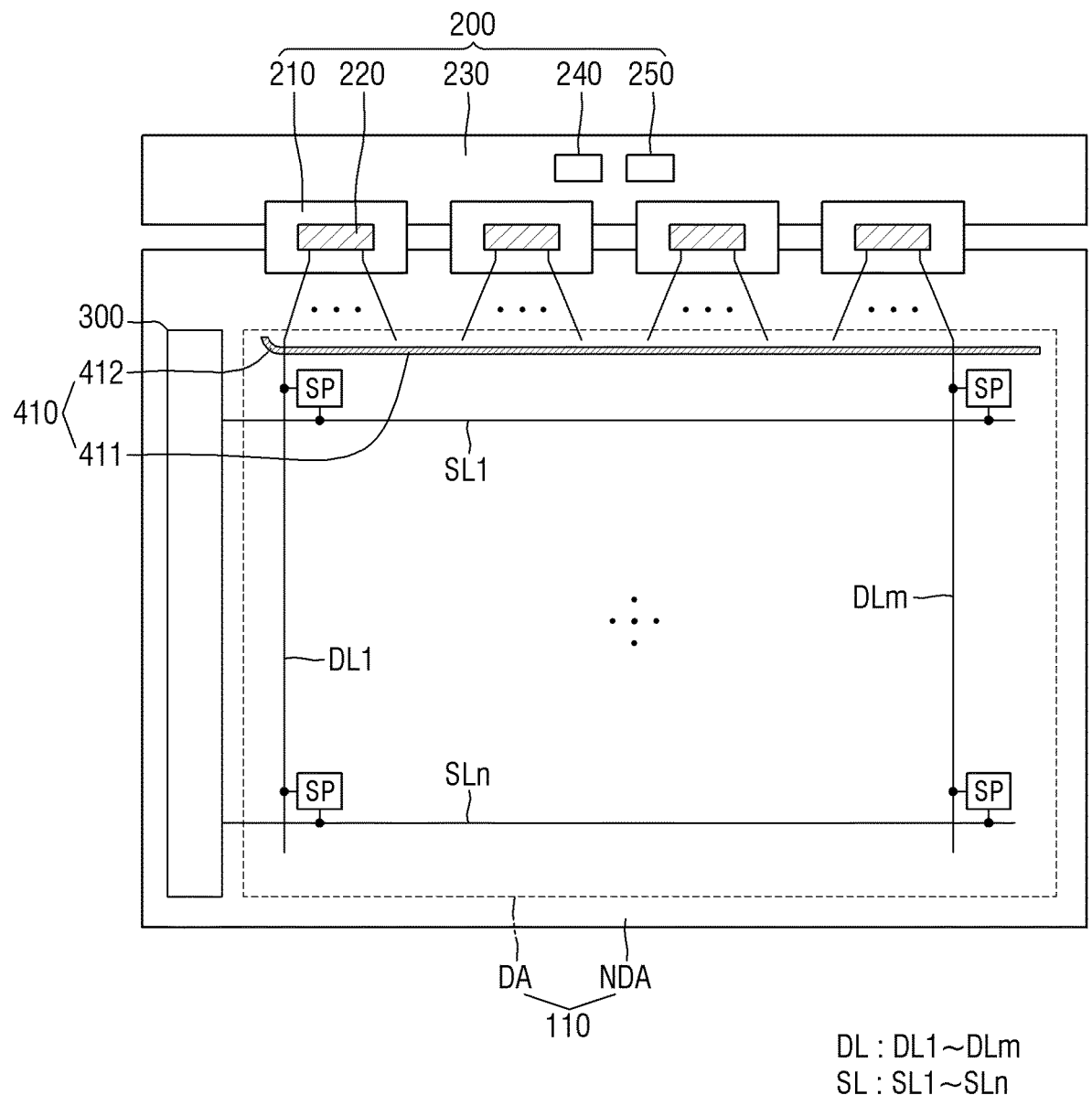
FIGS. 8, 9, 10, and 11 are views illustrating exemplary processes of forming the sealing member of the display device of FIG. 2.

In FIG. 8, the first sealing member 410 may be formed through a drawing process using a syringe. The straight portion 411 of the first sealing member 410 may be formed by drawing a syringe along a straight line extending from the upper right side to the upper left side of the display area DA, and the protrusion portion 412 of the first sealing member 410 may be formed by drawing a syringe along a curved line toward the upper side of the non-display area NDA.

Figure 9:
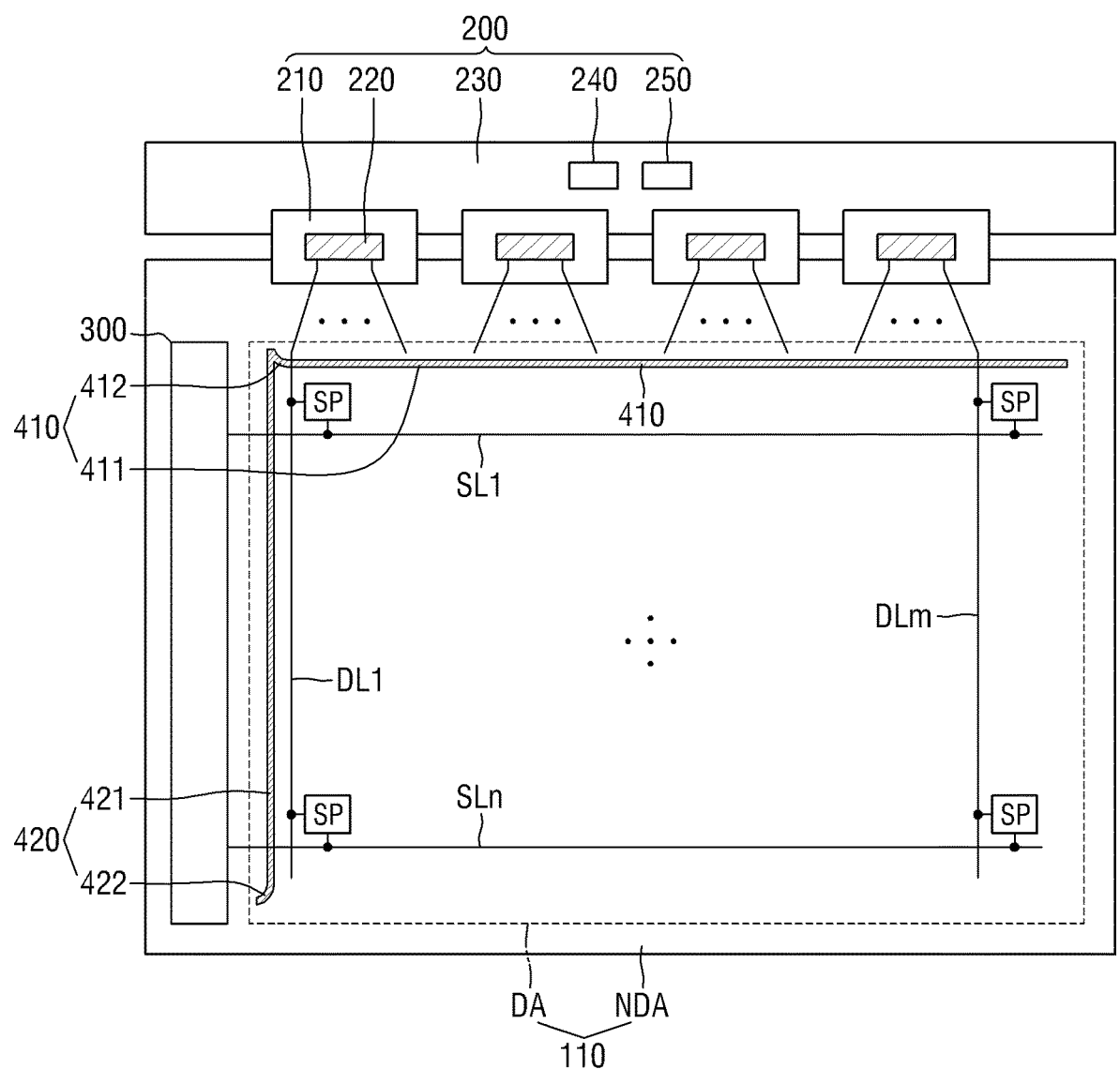

In FIG. 9, the process of forming the straight portion 421 of the second sealing member 420 may be performed subsequently to the process of forming the protrusion portion 412 of the first sealing member 410. The straight portion 421 of the second sealing member 420 may be formed by drawing a syringe along a straight line extending from the upper left side to the lower left side of the display area DA, and a protrusion portion 422 of the second sealing member 420 may be formed by drawing a syringe along a curved line toward the left side of the non-display area NDA.

Figure 10:
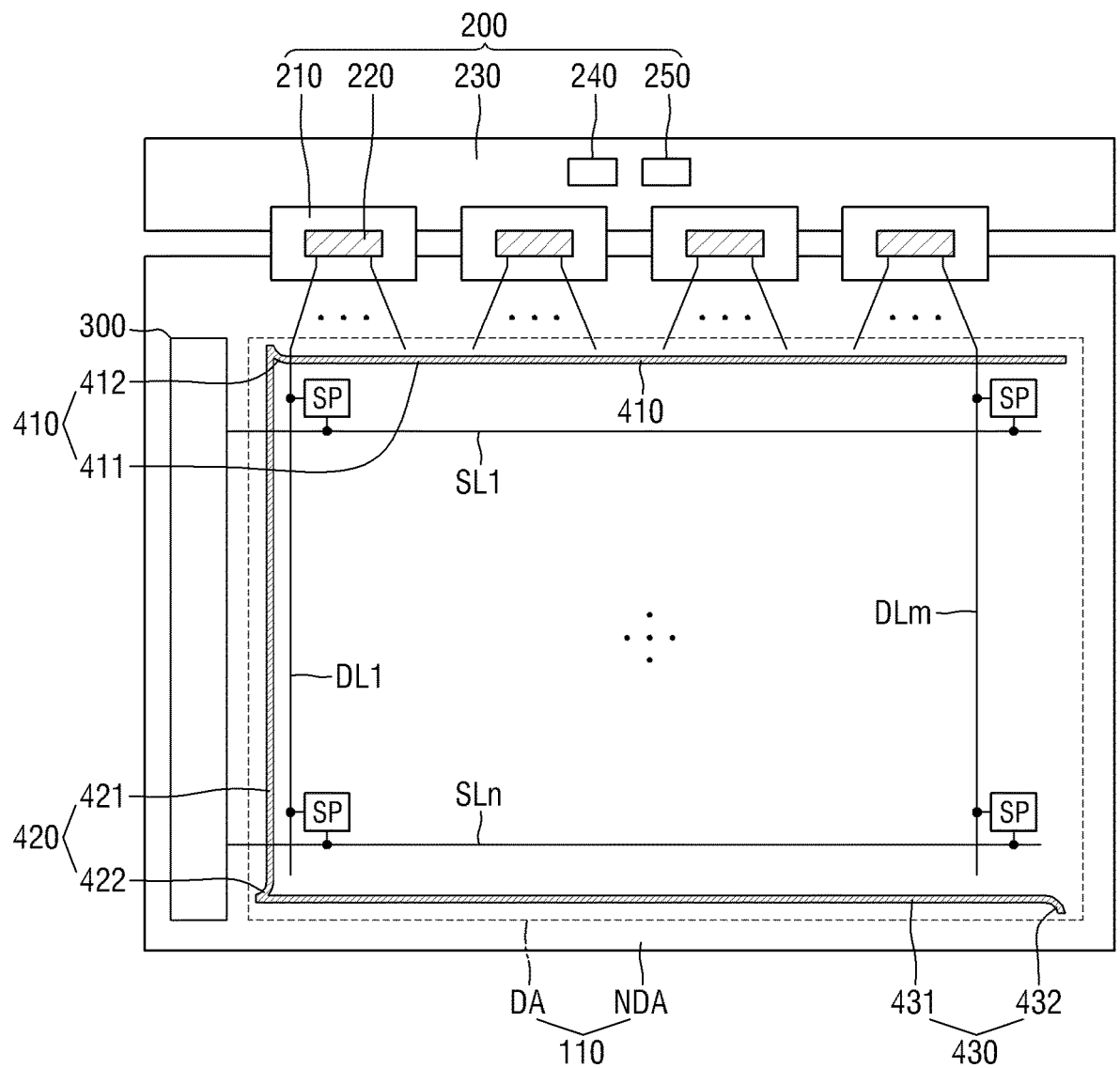

In FIG. 10, the process of forming a straight portion 431 of the third sealing member 430 may be performed subsequently to the process of forming the protrusion portion 422 of the second sealing member 420. The straight portion 431 of the third sealing member 430 may be formed by drawing a syringe along a straight line extending from the lower left side to the lower right side of the display area DA, and a protrusion portion 432 of the third sealing member 430 may be formed by drawing a syringe along a curved line toward the lower side of the non-display area NDA.

Figure 11:
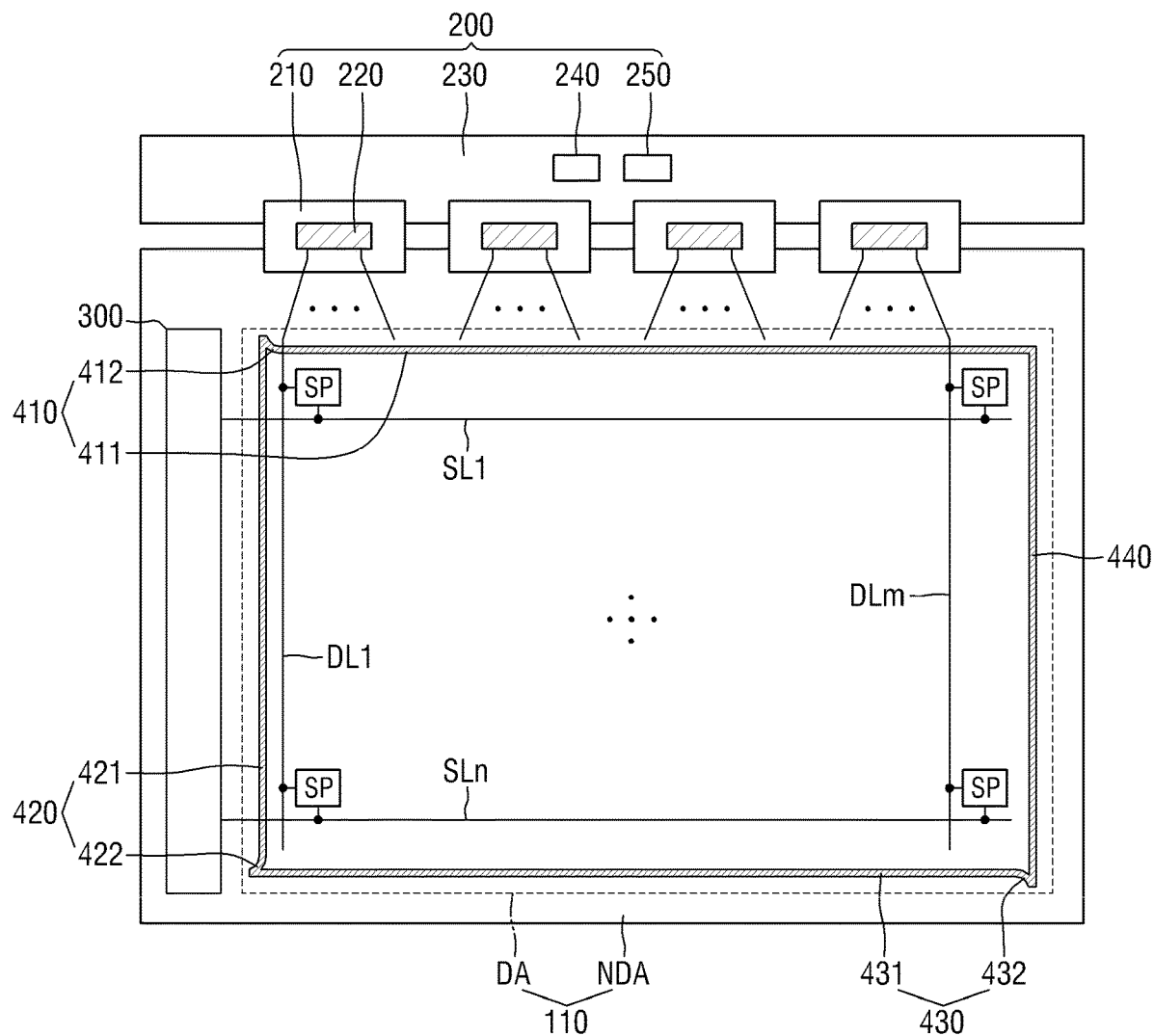

In FIG. 11, the process of forming the fourth sealing member 440 may be performed subsequently to the process of forming the protrusion portion 432 of the third sealing member 430. The fourth sealing member 440 may be formed by drawing a syringe along a straight line extending from the lower right side to the upper right side of the display area DA. The fourth sealing member 440 may be in contact with a right side of the straight portion 411 of the first sealing member 410, and thus, the sealing member 400 may form a sealed space capable of sealing the liquid crystal layer.

The sealing member 400 may be formed at the edge of the display area DA through a single process. Therefore, in the display device according to the exemplary embodiment, it is possible to shorten the process of forming the sealing member 400, prevent disconnection of the sealing member 400, and also prevent the sealing member 400 from being connected to the pixel electrode.

Figure 12:
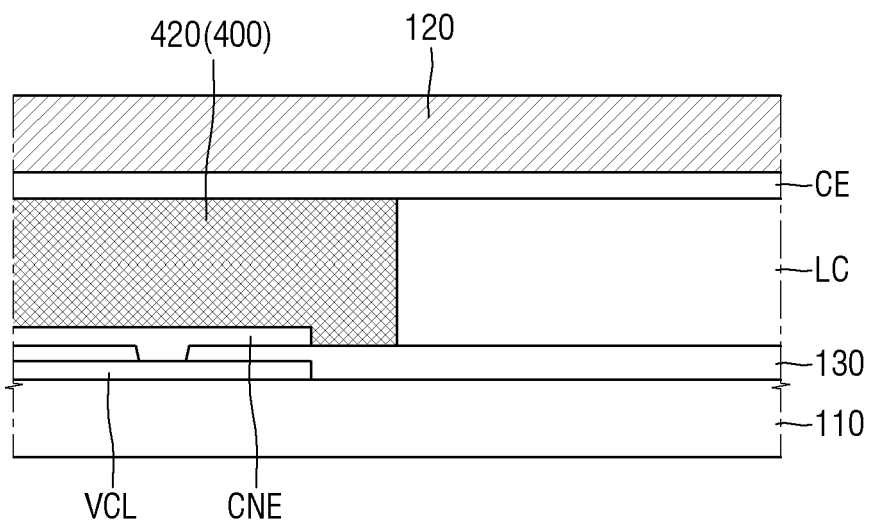
FIG. 12 is a cross-sectional view taken along line I-I' of FIG. 2.

FIG. 12 is a cross-sectional view taken along line I-I' of FIG. 2.

Referring to FIG. 12, the display device may include the first substrate 110, the common voltage line VCL, a gate insulating film 130, a connection electrode CNE, a liquid crystal layer LC, the sealing member 400, the common electrode CE, and the second substrate 120.

The common voltage line VCL may be disposed along the edge of the display area DA of the first substrate 110. The common voltage line VCL may be disposed to overlap the sealing member 400.

The gate insulating film 130 may cover the first substrate 110 and the common voltage line VCL. The gate insulating film 130 may include an inorganic insulating material such as a silicon compound or a metal oxide. For example, the gate insulating film 130 may be a single film or a multilayer film made of different materials.

The connection electrode CNE may be disposed on the gate insulating film 130. The connection electrode CNE may be connected to the common voltage line VCL through a contact hole formed in the gate insulating film 130.

The sealing member 400 may be disposed between the first substrate 110 and the second substrate 120 to surround the liquid crystal layer LC filling a space between the first substrate 110 and the second substrate 120. The sealing member 400 may be disposed on the connection electrode CNE and may be electrically connected to the common voltage line VCL through the connection electrode CNE.

The common electrode CE may be disposed on the second substrate 120. The second substrate 120 may be bonded to the first substrate 110, and thus, the common electrode CE on the second substrate 120 and the pixel electrode on the first substrate 110 may face each other.

For example, the common voltage line VCL may receive the common voltage VCOM from the power supply 250 or the display driver 200. The common voltage VCOM may be supplied to the connection electrode CNE and the sealing member 400 sequentially disposed on the common voltage line VCL. The sealing member 400 made of the conductive material may supply the common voltage VCOM to the common electrode CE disposed on the second substrate 120, and thus, the display device may not include a separate component for transmitting the common voltage VCOM other than the sealing member 400. Therefore, it is possible to minimize the bezel area of the display device.

Figure 13:
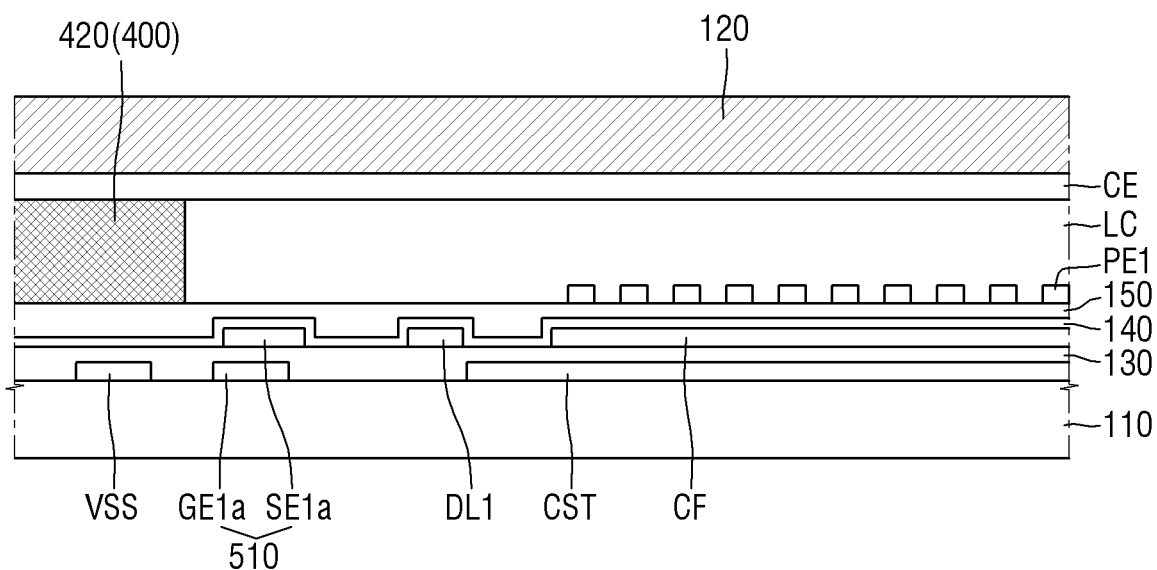
FIG. 13 is a cross-sectional view taken along line II-II' of FIG. 4.

FIG. 13 is a cross-sectional view taken along line II-IF of FIG. 4. Hereinafter, the same components as the above-described components will be described briefly or omitted to avoid redundancy.

Referring to FIG. 13, the display device may include the first substrate 110, the ground line VSS, the first electrostatic discharge protection element 510, the ground electrode of the storage capacitor CST, the gate insulating film 130, the first data line DL1, a color filter CF, a protective film 140, a planarization film 150, the first pixel electrode PE1, the liquid crystal layer LC, the sealing member 400, the common electrode CE, and the second substrate 120.

The ground line VSS may extend from the ground electrode of the storage capacitor CST along the edge of the display area DA and may be connected to the ground portion of the first substrate 110. The ground line VSS may be disposed parallel to the common voltage line VCL at a peripheral portion of the display area DA.

The first electrostatic discharge protection element 510 may be disposed along the left edge of the display area DA. The first electrostatic discharge protection element 510 may include the first gate electrode GE1a and the first source electrode SE1a. The first gate electrode GE1a may be disposed on the first substrate 110 and may be covered by the gate insulating film 130. The first source electrode SE1a may be disposed on the gate insulating film 130 and may be insulated from the first gate electrode GE1a by the gate insulating film 130.

The ground electrode of the storage capacitor CST may be disposed on the first substrate 110 to overlap the first pixel electrode PE1. One end of the storage capacitor CST may be formed of the first pixel electrode PE1, and the other end of the storage capacitor CST may be formed of the ground electrode. The first pixel electrode PE1 may receive a data voltage, and the ground electrode may correspond to an electrode extending from the ground line VSS. The ground line VSS may be grounded through the ground portion of the first substrate 110.

The first data line DL1 may be disposed on the gate insulating film 130 and may extend in the second direction (Y-axis direction). The first data line DL1 may supply a data voltage to the first pixel electrode PE1 through the first switching transistor ST1 of the first pixel SP1.

The color filter CF may be disposed on the gate insulating film 130 to overlap the first pixel electrode PE1. The color filter CF may provide a specific color to light passing through the display panel 100. For example, the color filter may be one of a red color filter, a green color filter, and a blue color filter. In another example, the color filter may transmit white light without change.

The protective film 140 may cover the first source electrode SE1a of the first electrostatic discharge protection element 510, the first data line DL1, and the color filter CF. For example, the protective film 140 may be made of an organic material and may protect the first source electrode SE1a of the first electrostatic discharge protection element 510, the first data line DL1, and the color filter CF. The planarization film 150 may be disposed on the protective film 140 to planarize an upper end of the first substrate 110.

The sealing member 400 may be disposed between the first substrate 110 and the second substrate 120 to surround the liquid crystal layer LC filling a space between the first substrate 110 and the second substrate 120. The sealing member 400 may be provided along the edge of the display area DA to bond the first substrate 110 and the second substrate 120 to each other. The sealing member 400 may prevent the liquid crystal layer LC from leaking to the outside of the display area DA by sealing the liquid crystal layer LC.

The sealing member 400 may surround the edge of the display area DA so as to not overlap the plurality of pixels SP. As illustrated in FIG. 2, the upper left corner of the sealing member 400 may protrude toward the upper side of the non-display area NDA, and thus, the second sealing member 420 may not overlap the first pixel electrode PE1. The sealing member 400 may be disposed to overlap the common voltage line VCL, thereby minimizing the bezel area of the display device. For example, the sealing member 400 may overlap the ground line VSS provided along the edge of the display area DA, but exemplary embodiments are not necessarily limited thereto. For example, the sealing member 400 may not overlap the plurality of first electrostatic discharge protection elements 510, but exemplary embodiments are not necessarily limited thereto. Therefore, the sealing member 400 may overlap the common voltage line VCL and may not overlap the plurality of pixels SP, thereby preventing the common voltage from being supplied to the pixel electrode while minimizing the size of the bezel area.

Figure 14:
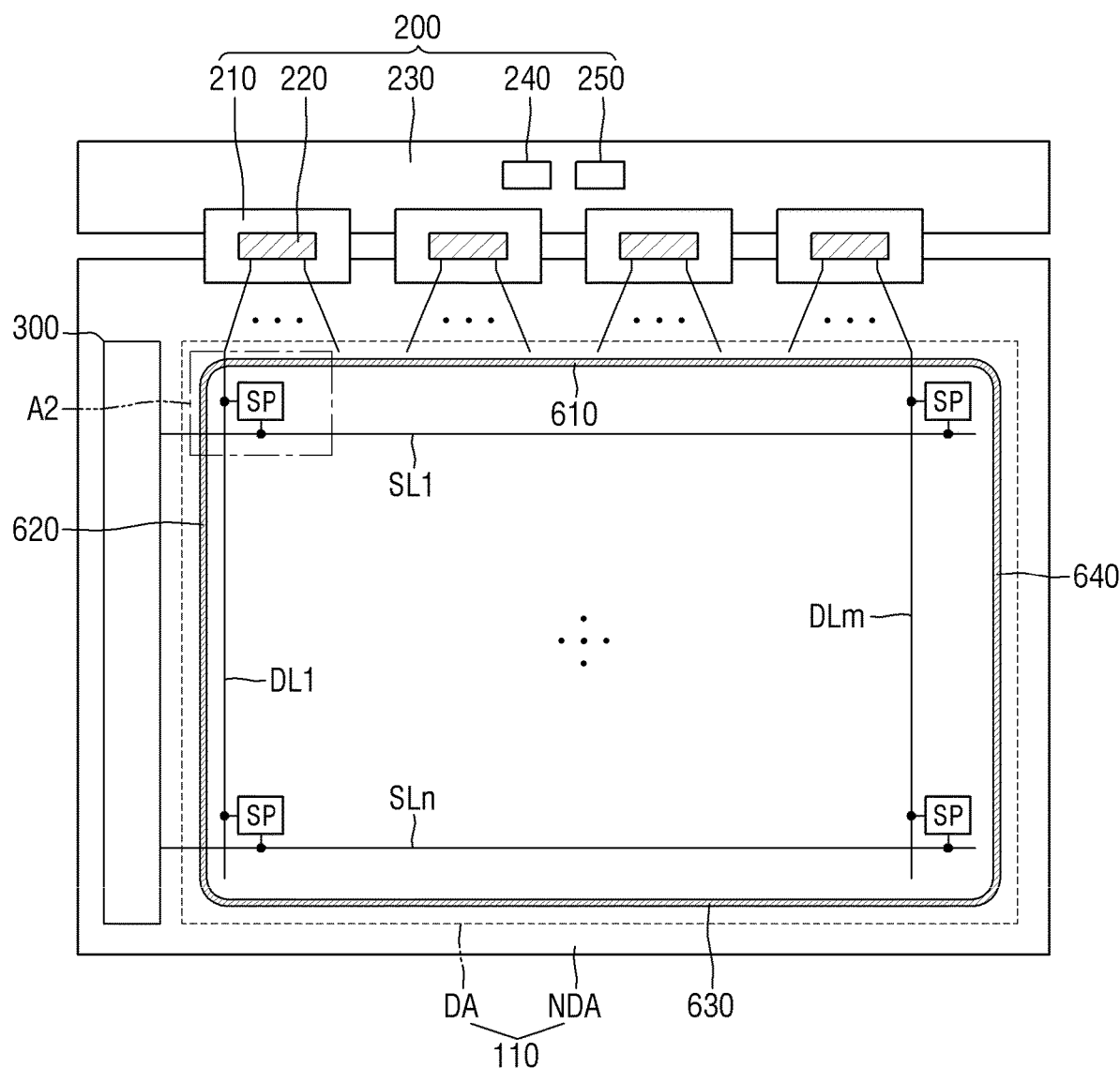
FIG. 14 is a plan view of another exemplary embodiment of a display device constructed according to the principles of the invention.

FIG. 14 is a plan view of another exemplary embodiment of a display device constructed according to the principles of the invention. The display device according to FIGS. 14 to 19 differs from the above-described display device only in configurations of a sealing member 600 and a first pixel electrode PE1, and the same components as the above-described components will be briefly described or omitted to avoid redundancy.

Referring to FIG. 14, the display device may include a display panel 100 and a display driver 200.

The display panel 100 may include a first substrate 110 and a second substrate 120. The first substrate 110 and the second substrate 120 may be made of glass or plastic. For example, the display panel 100 may be implemented as a liquid crystal display panel including a liquid crystal layer disposed between the first substrate 110 and the second substrate 120. The first substrate 110 may include a display area DA and a non-display area NDA.

The display driver 200 may be connected to a pad portion provided in the non-display area NDA of the first substrate 110 and may allow a plurality of pixels to display images based on image data supplied from a display driving system. The display driver 200 may include a flexible film 210, a data driver 220, a circuit board 230, a timing controller 240, and a power supply 250.

The sealing member 600 may be disposed between the first substrate 110 and the second substrate 120 to surround a liquid crystal layer filling a space between the first substrate 110 and the second substrate 120. The sealing member 600 may be provided along an edge of the display area DA to bond the first substrate 110 and the second substrate 120 to each other. The sealing member 600 may prevent the liquid crystal layer from leaking to the outside of the display area DA by sealing the liquid crystal layer.

The sealing member 600 may include first to fourth sealing members 610 to 640. The first sealing member 610 may be disposed along an upper edge of the display area DA. The second sealing member 620 may be disposed along a left edge of the display area DA. The third sealing member 630 may be disposed along a lower edge of the display area DA. The fourth sealing member 640 may be disposed along a right edge of the display area DA.

The sealing member 600 may be made of a conductive material and may electrically connect a common voltage line disposed on the first substrate 110 and a common electrode disposed on the second substrate 120. Accordingly, since the sealing member 600 concurrently performs the function of supplying a common voltage supplied from the first substrate 110 to the common electrode of the second substrate 120 and the function of sealing the liquid crystal layer, it is possible to omit a separate component disposed in a bezel area of the display device, thereby minimizing the bezel area. The sealing member 600 may overlap pixel areas of some pixels SP but may not be connected to pixel electrodes of some pixels SP. Accordingly, in the display device according to the exemplary embodiment, the sealing member 600 through which the common voltage flows may be prevented from being connected to the pixel electrode of the pixel SP, thereby preventing the common voltage from being supplied to the pixel electrode while minimizing the size of the bezel area of the display device.

The sealing member 600 may be formed at the edge of the display area DA through a single process using an injection member. For example, a conductive sealing material may be injected between the first substrate 110 and the second substrate 120 through a single process using a syringe. Therefore, in the display device according to the exemplary embodiment, it is possible to shorten a process of forming the sealing member 600, prevent disconnection of the sealing member 600, and also prevent the sealing member 600 from being connected to the pixel electrode.

Figure 15:
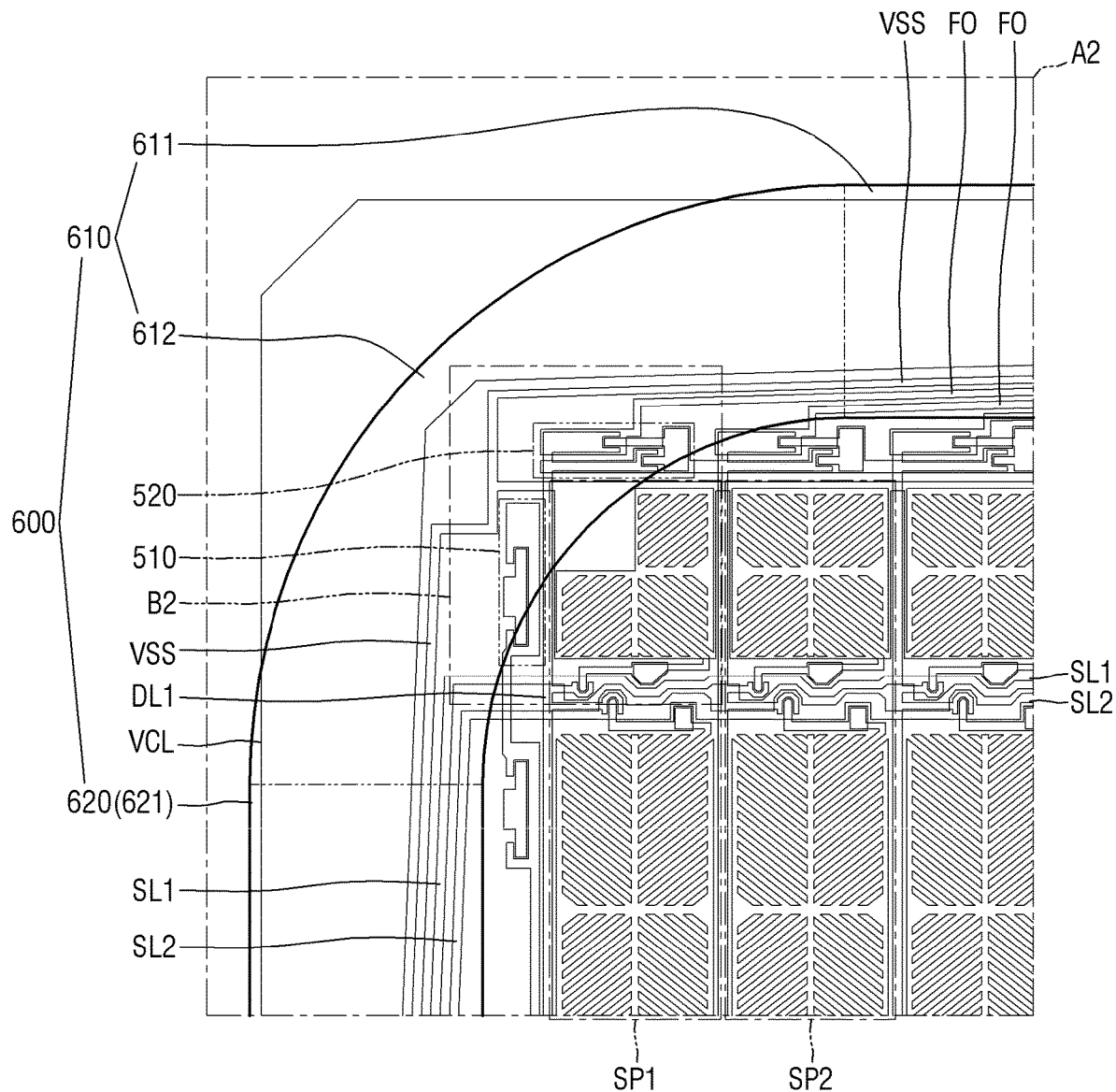
FIG. 15 is an enlarged view of a specific area A2 of FIG. 14.
Figure 16:
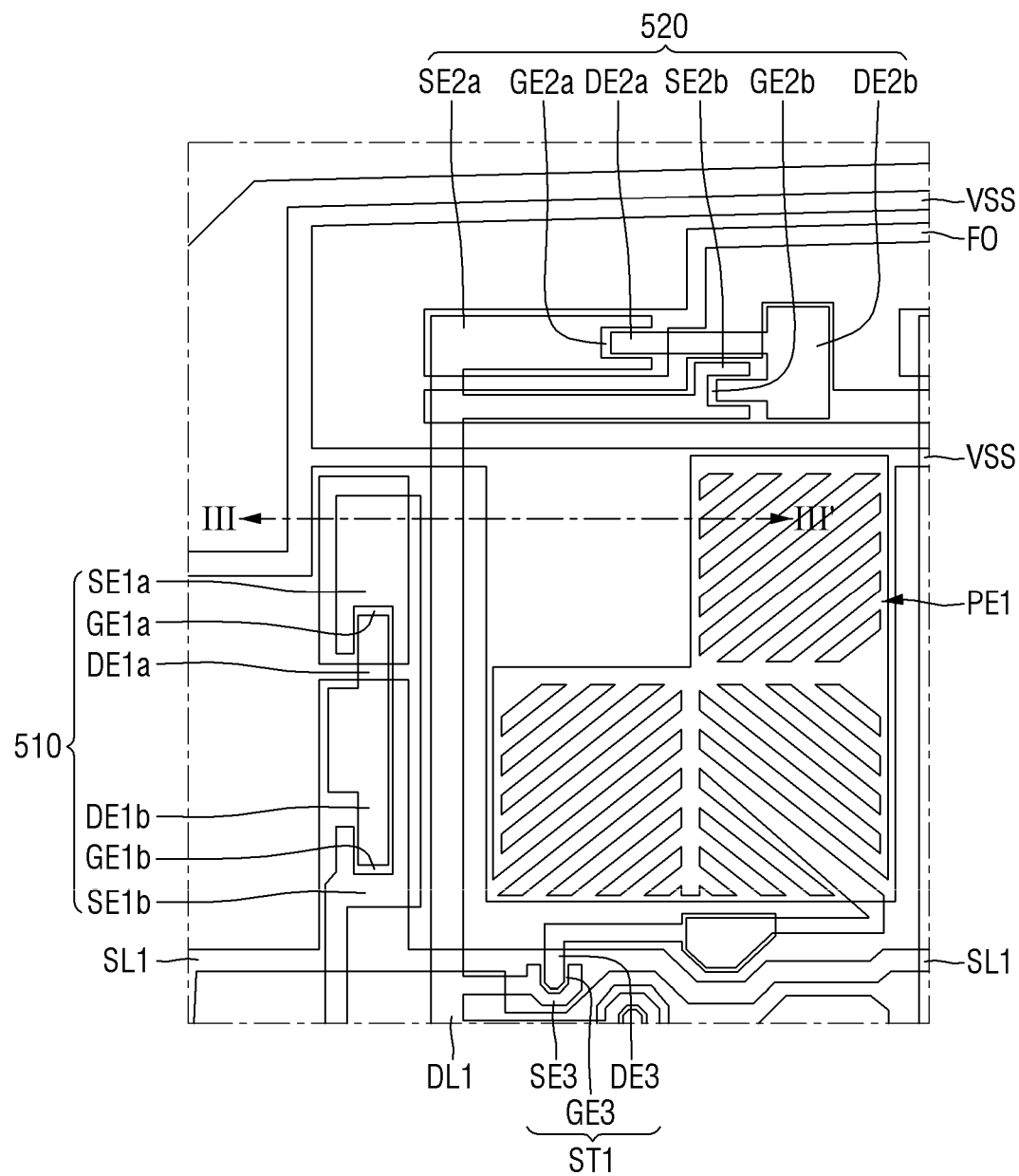
FIG. 16 is an enlarged view of a specific area B2 of FIG. 15.

FIG. 15 is an enlarged view of a specific area A2 of FIG. 14, and FIG. 16 is an enlarged view of a specific area B2 of FIG. 15.

Referring to FIGS. 15 and 16, the display device may further include a common voltage line VCL, a ground line VSS, a first electrostatic discharge protection element 510, and a second electrostatic discharge protection element 520.

The common voltage line VCL may be disposed along the edge of the display area DA of the first substrate 110. The common voltage line VCL may be disposed to overlap the sealing member 600 and may be connected to the sealing member 600 through a connection electrode. For example, the common voltage line VCL may receive a common voltage from the power supply 250 or the display driver 200. The common voltage may be supplied to the connection electrode and the sealing member 600 sequentially disposed on the common voltage line VCL. The sealing member 600 made of the conductive material may supply the common voltage to the common electrode disposed on the second substrate 120, and thus, the display device may not include a separate component for transmitting the common voltage other than the sealing member 600. Therefore, it is possible to minimize the bezel area of the display device.

The ground line VSS may be connected to a ground electrode of a storage capacitor of each of the plurality of pixels SP. For example, the ground electrode of the storage capacitor of each of the plurality of pixels SP may be formed as a common electrode, but is exemplary embodiments are not necessarily limited thereto. The ground line VSS may extend from the ground electrode of the storage capacitor along the edge of the display area DA and may be connected to a ground portion of the first substrate 110.

The first electrostatic discharge protection element 510 may include a plurality of first electrostatic discharge protection elements 510 disposed along the left edge of the display area DA. Each of the plurality of first electrostatic discharge protection elements 510 may be surrounded by at least some of a scan line SL, the ground line VSS, the ground electrode of the pixel SP, and a first data line DL1.

The second electrostatic discharge protection element 520 may include a plurality of second electrostatic discharge protection elements 520 disposed along the upper edge of the display area DA. Each of the plurality of second electrostatic discharge protection elements 520 may be surrounded by at least some of a fan-out line FO, the ground line VSS, the ground electrode of the pixel SP, and a data line DL.

Referring to FIG. 14, the sealing member 600 may include the first to fourth sealing members 610 to 640. The first sealing member 610 may be disposed along the upper edge of the display area DA. The second sealing member 620 may be disposed along the left edge of the display area DA. The third sealing member 630 may be disposed along the lower edge of the display area DA. The fourth sealing member 640 may be disposed along the right edge of the display area DA.

The first sealing member 610 may include a straight portion 611 and a round portion 612. The straight portion 611 of the first sealing member 610 may be connected to the fourth sealing member 640 and may extend along the upper edge of the display area DA. The round portion 612 of the first sealing member 610 may be angled toward a straight portion 621 of the second sealing member 620 from the straight portion 611. The round portion 612 of the first sealing member 610 may be roundly formed to have a certain curvature.

The round portion 612 of the first sealing member 610 may overlap pixel areas of some pixels SP1 of the plurality of pixels SP. For example, in order to reduce the bezel area of the display device, the sealing member 600 may be disposed adjacent to the plurality of pixels SP, and the round portion of the sealing member 600 may have a certain curvature. The round portion of the sealing member 600 may overlap a pixel area of a pixel SP disposed at each of a plurality of corners of the display area DA and may not overlap pixel areas of pixels SP disposed in areas except for the plurality of corners.

For example, the round portion 612 of the first sealing member 610 may overlap the pixel area of a first pixel SP1 disposed at an upper left corner of the display area DA and may not overlap the pixel area of a second pixel SP2 adjacent to a right side of the first pixel SP1. For example, referring to FIG. 15, the size of the first pixel electrode PE1 may be reduced by an area of the area of the first pixel SP1 that overlaps the round portion 612 of the first sealing member 610. Accordingly, the round portion 612 of the first sealing member 610 may overlap the pixel area of the first pixel SP1 but may not overlap the first pixel electrode PE1 of the first pixel SP1. Accordingly, in the display device, the sealing member 600 may be prevented from being connected to the pixel electrode of the pixel SP, thereby preventing the common voltage from being supplied to the pixel electrode while minimizing a size of the bezel area of the display device.

For example, the size of the first pixel electrode PE1 of the first pixel SP1 overlapping the sealing member 600 may be smaller than the size of the pixel electrode of the second pixel SP2 not overlapping the sealing member 600. In the first pixel SP1, the size of the first pixel electrode PE1 may be greatly reduced in order to prevent a connection between the first pixel electrode PE1 and the sealing member 600. Since the second pixel SP2 does not overlap the sealing member 600, the size of the pixel electrode thereof may be maintained by as much as the size of the pixel area thereof. Therefore, in the display device, the size of the first pixel electrode PE1 of the first pixel SP1 overlapping the sealing member 600 may be reduced to be smaller than the size of the pixel electrode of the second pixel SP2, thereby preventing a connection between the first pixel electrode PE1 of the first pixel SP1 and the sealing member 600.

For example, the difference between a size of the pixel area of the first pixel SP1 overlapping the sealing member 600 and the size of the first pixel electrode PE1 of the first pixel SP1 may be determined according to the area of the first pixel SP1 overlapping the sealing member 600. For example, as the area of the pixel area of the first pixel SP1 overlapping the sealing member 600 is increased, the size of the first pixel electrode PE1 of the first pixel SP1 may be reduced. The size of the first pixel electrode PE1 may be reduced by as much as the area of the first pixel SP1 overlapping the sealing member 600, and the first pixel electrode PE1 may be disposed in a area not overlapping the sealing member 600. The first pixel SP1 may perform the function of a pixel by disposing the first pixel electrode PE1 in the area not overlapping the sealing member 600. Therefore, in the display device, the size of the first pixel electrode PE1 of the first pixel SP1 may be reduced by an area in which the sealing member 600 and the first pixel SP overlap each other, thereby preventing the sealing member 600 from being connected to the first pixel electrode PE1 of the first pixel SP1.

For example, the first sealing member 610 may be formed through a drawing process using a syringe. The straight portion 611 of the first sealing member 610 may be formed by drawing a syringe along a straight line, and the round portion 612 may be formed by drawing a syringe along a curved line. The process of forming a straight portion 621 of the second sealing member 620 may be performed subsequently to the process of forming the round portion 612 of the first sealing member 610. Processes of forming the third and fourth sealing members 630 and 640 may also be performed subsequently to the process of forming the second sealing member 620. Therefore, the sealing member 600 may be formed at the edge of the display area DA through a single process.

The sealing member 600 may surround the edge of the display area DA so as to not overlap the pixel electrodes of the plurality of pixels SP. The sealing member 600 may be disposed to overlap the common voltage line VCL, thereby minimizing the bezel area of the display device. In order to reduce the bezel area of the display device, the sealing member 600 may be disposed adjacent to the plurality of pixels SP. For example, the sealing member 600 may overlap the fan-out line FO and the scan line SL provided along the edge of the display area DA, but exemplary embodiments are not necessarily limited thereto. For example, the sealing member 600 may overlap at least one first electrostatic discharge protection element 510 and at least one second electrostatic discharge protection elements 520, but exemplary embodiments are not necessarily limited thereto. Therefore, the sealing member 600 may overlap the common voltage line VCL and may not overlap the pixel electrodes of the plurality of pixels SP, thereby preventing the common voltage from being supplied to the pixel electrode while minimizing the size of the bezel area.

Figure 17:
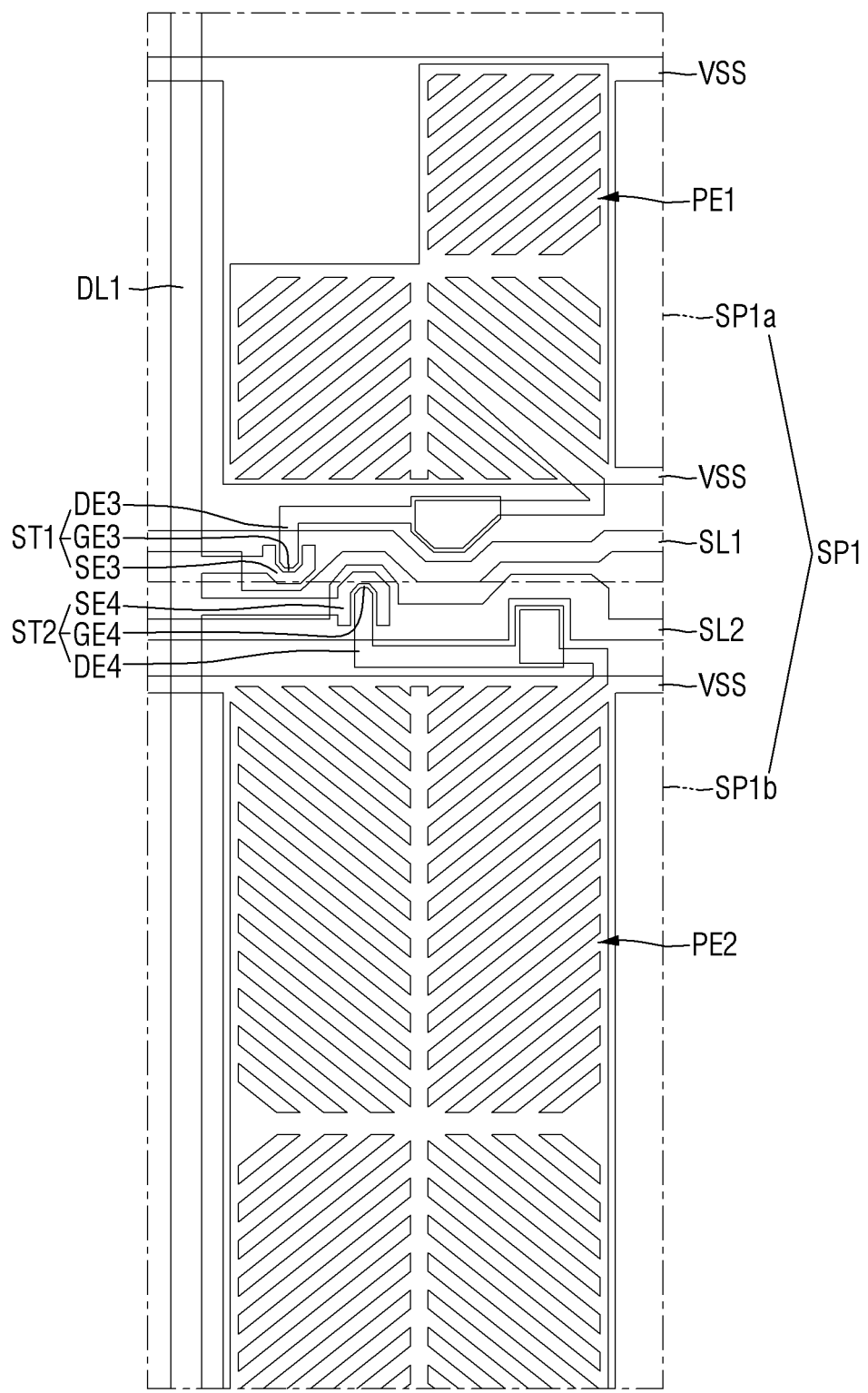
FIG. 17 is a plan view of an exemplary embodiment of a first pixel of the display device of FIG. 14.
Figure 18:
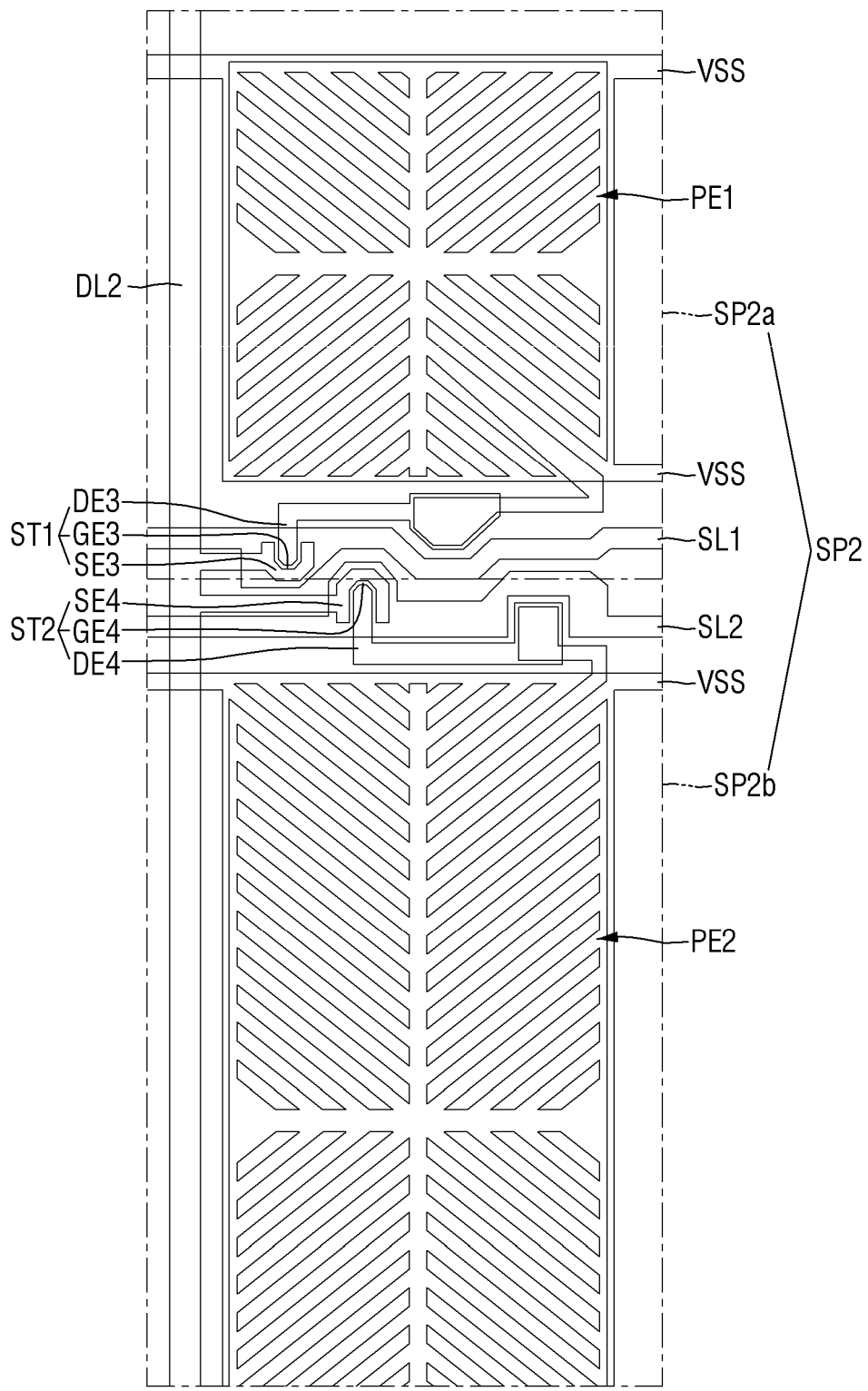
FIG. 18 is a plan view of an exemplary embodiment of a second pixel of the display device of FIG. 14.

FIG. 17 is a plan view of an exemplary embodiment of the first pixel of the display device of FIG. 14, and FIG. 18 is a plan view illustrating the second pixel of the display device of FIG. 14. Hereinafter, the same components as the above-described components will be briefly described or omitted to avoid redundancy.

Referring to FIGS. 17 and 18, the first pixel SP1 may include a first subpixel SP1*a* and a second subpixel SP1*b*. The first subpixel SP1*a* may include a first switching transistor ST1 and a first pixel electrode PE1, and the second subpixel SP1*b* may include a second switching transistor ST2 and a second pixel electrode PE2.

The second pixel SP2 may include a first subpixel SP2*a* and a second subpixel SP2*b*. The first subpixel SP2*a* may include a first switching transistor ST1 and a first pixel electrode PE1, and the second subpixel SP2*b* may include a second switching transistor ST2 and a second pixel electrode PE2.

As shown in FIG. 15, the round portion 612 of the first sealing member 610 may overlap pixel areas of some pixels SP1 of the plurality of pixels SP. For example, in order to reduce the bezel area of the display device, the sealing member 600 may be disposed adjacent to the plurality of pixels SP, and the round portion of the sealing member 600 may have a certain curvature. The round portion of the sealing member 600 may overlap the pixel area of the pixel SP disposed at each of the plurality of corners of the display area DA and may not overlap pixel areas of the pixels SP disposed in areas except for the plurality of corners.

For example, the round portion 612 of the first sealing member 610 may overlap the pixel area of the first pixel SP1 disposed at the upper left corner of the display area DA and may not overlap the pixel area of the second pixel SP2 adjacent to a right side of the first pixel SP1. The size of the first pixel electrode PE1 may be reduced by the area of the area of the first pixel SP1 overlapping the round portion 612 of the first sealing member 610. Accordingly, the round portion 612 of the first sealing member 610 may overlap the pixel area of the first pixel SP1 but may not overlap the first pixel electrode PE1 of the first pixel SP1. In the display device, the sealing member 600 may be prevented from being connected to the first pixel electrode PE1 of the first pixel SP1, thereby preventing the common voltage from being supplied to the first pixel electrode PE1 while minimizing the size of the bezel area.

For example, the size of the first pixel electrode PE1 of the first pixel SP1 overlapping the sealing member 600 may be smaller than the size of the first pixel electrode PE1 of the second pixel SP2 not overlapping the sealing member 600. In the first pixel SP1, the size of the first pixel electrode PE1 may be greatly reduced to prevent a connection between the first pixel electrode PE1 and the sealing member 600. Since the second pixel SP2 does not overlap the sealing member 600, the size of the first pixel electrode PE1 thereof may be maintained by as much as the size of the pixel area thereof. Therefore, in the display device, the size of the first pixel electrode PE1 of the first pixel SP1 overlapping the sealing member 600 may be reduced to be smaller than the size of the first pixel electrode PE1 of the second pixel SP2, thereby preventing a connection between the first pixel electrode PE1 of the first pixel SP1 and the sealing member 600.

Figure 19:
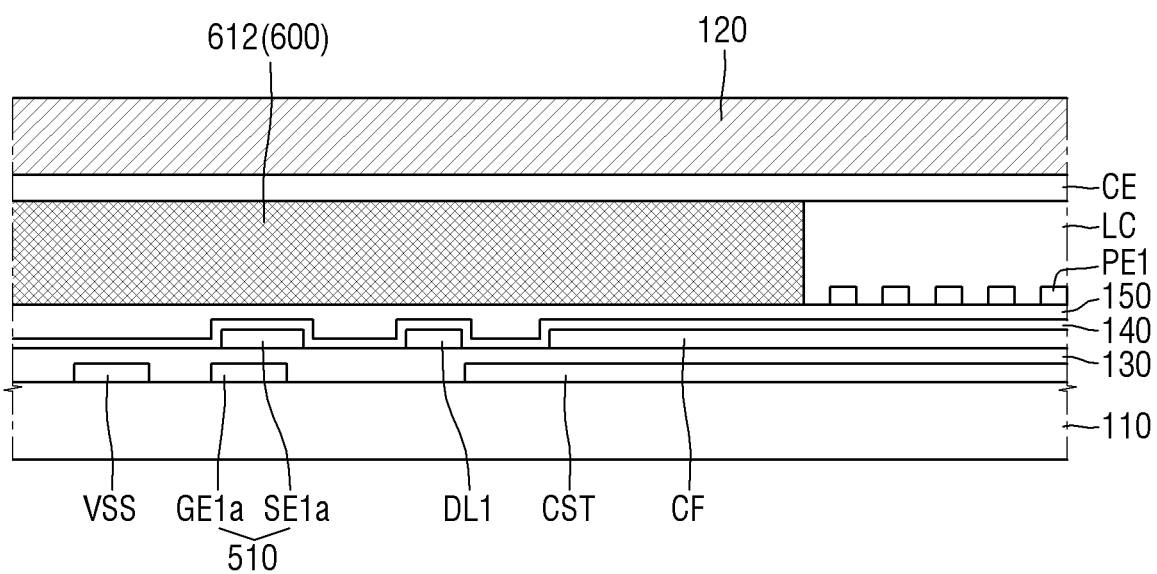
FIG. 19 is a cross-sectional view taken along line III-III' of FIG. 16.

FIG. 19 is a cross-sectional view taken along line III-III' of FIG. 16.

Referring to FIG. 19, the display device may include the first substrate 110, the ground line VSS, the first electrostatic discharge protection element 510, a ground electrode of a storage capacitor CST, a gate insulating film 130, the first data line DL1, a color filter CF, a protective film 140, a planarization film 150, the first pixel electrode PE1, a liquid crystal layer LC, the sealing member 600, a common electrode CE, and the second substrate 120.

The ground line VSS may extend from the ground electrode of the storage capacitor CST along the edge of the display area DA and may be connected to the ground portion of the first substrate 110. The ground line VSS may be disposed parallel to the common voltage line VCL at a peripheral portion of the display area DA.

The first electrostatic discharge protection element 510 may be disposed along the left edge of the display area DA. The first electrostatic discharge protection element 510 may include a first gate electrode GE1a and a first source electrode SE1a. The first gate electrode GE1a may be disposed on the first substrate 110 and may be covered by the gate insulating film 130. The first source electrode SE1a may be disposed on the gate insulating film 130 and may be insulated from the first gate electrode GE1a by the gate insulating film 130.

The ground electrode of the storage capacitor CST may be disposed in the pixel area of the pixel SP disposed on the first substrate 110. For example, when the sealing member 600 overlaps a portion of the pixel area of the first pixel SP1, a portion of the ground electrode of the storage capacitor CST may overlap the sealing member 600, and the other portion of the ground electrode of the CST may overlap the first pixel electrode PE1. Therefore, even when the size of the first pixel electrode PE1 is reduced, the ground electrode of the storage capacitor CST may easily perform a grounding function.

The first data line DL1 may be disposed on the gate insulating film 130 and may extend in a second direction (Y-axis direction). The first data line DL1 may supply a data voltage to the first pixel electrode PE1 through the first switching transistor ST1 of the first pixel SP1.

The color filter CF may be disposed on the gate insulating film 130 to overlap the first pixel electrode PE1. For example, when the sealing member 600 overlaps a portion of the pixel area of the first pixel SP1, a portion of the color filter CF may overlap the sealing member 600, and the other portion of the color filter CF may overlap the first pixel electrode PE1. The color filter CF may provide a specific color to light passing through the display panel 100.

The protective film 140 may cover the first source electrode SE1a of the first electrostatic discharge protection element 510, the first data line DL1, and the color filter CF. For example, the protective film 140 may be made of an organic material and may protect the first source electrode SE1a of the first electrostatic discharge protection element 510, the first data line DL1, and the color filter CF. The planarization film 150 may be disposed on the protective film 140 to planarize an upper end of the first substrate 110.

The sealing member 600 may be disposed between the first substrate 110 and the second substrate 120 to surround the liquid crystal layer LC filling a space between the first substrate 110 and the second substrate 120. The sealing member 600 may be provided along the edge of the display area DA to bond the first substrate 110 and the second substrate 120 to each other. The sealing member 600 may prevent the liquid crystal layer LC from leaking to the outside of the display area DA by sealing the liquid crystal layer LC.

Referring to FIGS. 14 and 15, the sealing member 600 may surround the edge of the display area DA so as to not overlap the pixel electrodes of the plurality of pixels SP. It is possible to reduce the size of the first pixel electrode PE1 of the first pixel SP1 overlapping the sealing member 600, and thus, the sealing member 600 may not overlap the first pixel electrode PE1. The sealing member 600 may be disposed to overlap the common voltage line VCL, thereby minimizing the bezel area of the display device. For example, the sealing member 600 may overlap the ground line VSS provided along the edge of the display area DA, but exemplary embodiments are not necessarily limited thereto. For example, the round portion 612 of the sealing member 600 may overlap the plurality of first electrostatic discharge protection elements 510 and the first data line DL1, but exemplary embodiments are not necessarily limited thereto. Therefore, the sealing member 600 may overlap the common voltage line VCL and may not overlap the pixel electrodes of the plurality of pixels SP, thereby preventing the common voltage from being supplied to the pixel electrode while minimizing the size of the bezel area.

Figure 20:
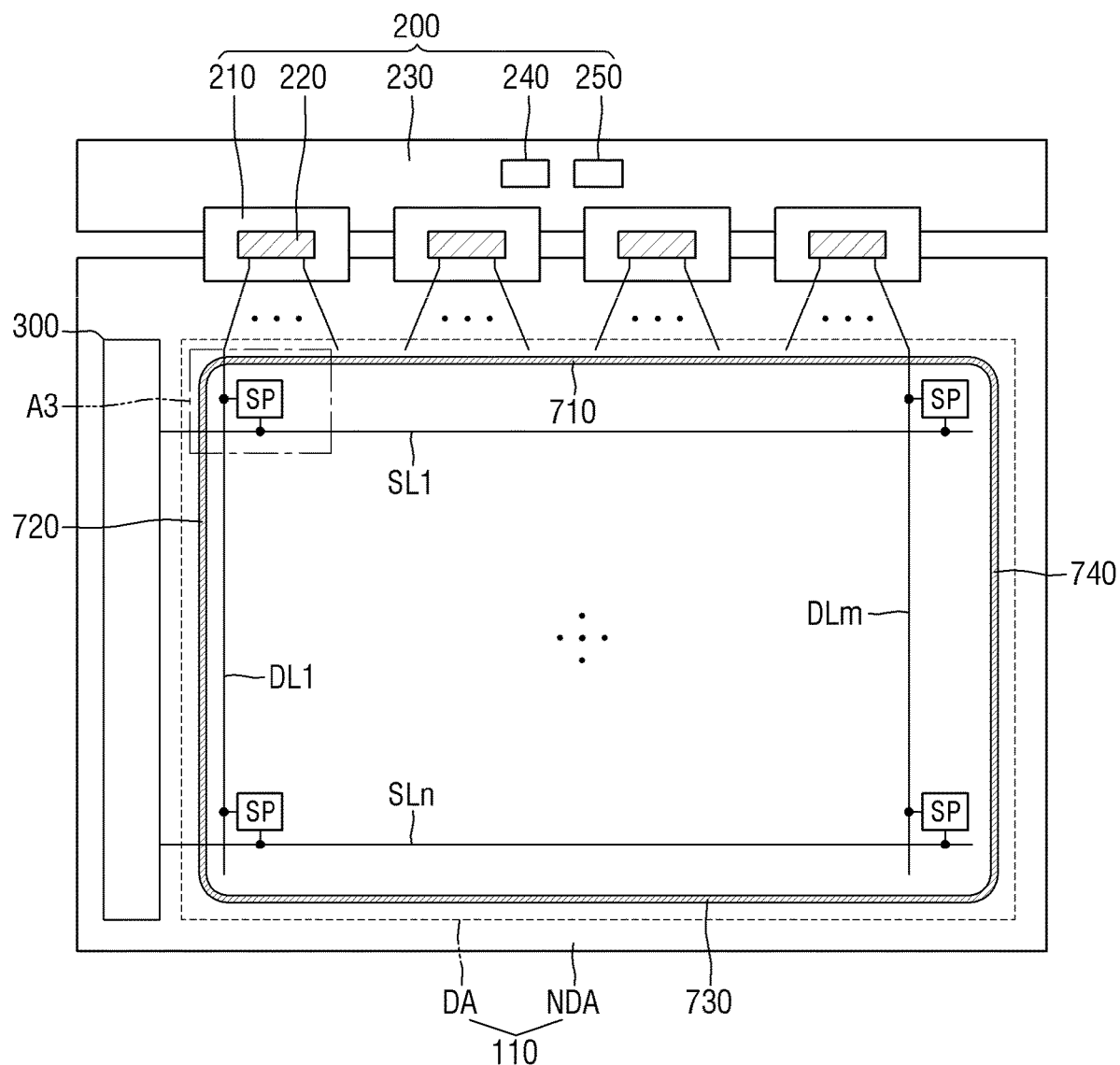
FIG. 20 is a plan view of still another exemplary embodiment of a display device constructed according to the principles of the invention.

FIG. 20 is a plan view of still another exemplary embodiment of a display device constructed according to the principles of the invention. The display device of FIGS. 20 to 23 further includes an insulating member 180 shown in FIG. 23, and the same components as the above-described components will be briefly described or omitted to avoid redundancy.

Referring to FIG. 20, the display device may include a display panel 100 and a display driver 200.

The display panel 100 may include a first substrate 110 and a second substrate 120. The first substrate 110 and the second substrate 120 may be made of glass or plastic. For example, the display panel 100 may be implemented as a liquid crystal display panel including a liquid crystal layer disposed between the first substrate 110 and the second substrate 120. The first substrate 110 may include a display area DA and a non-display area NDA.

The display driver 200 may be connected to a pad portion provided in the non-display area NDA of the first substrate 110 and may allow a plurality of pixels to display images based on image data supplied from a display driving system. The display driver 200 may include a flexible film 210, a data driver 220, a circuit board 230, a timing controller 240, and a power supply 250.

A sealing member 700 may be disposed between the first substrate 110 and the second substrate 120 to surround the liquid crystal layer filling a space between the first substrate 110 and the second substrate 120. The sealing member 700 may be provided along an edge of the display area DA to bond the first substrate 110 and the second substrate 120 to each other. The sealing member 700 may prevent the liquid crystal layer from leaking to the outside of the display area DA by sealing the liquid crystal layer.

The sealing member 700 may include first to fourth sealing members 710 to 740. The first sealing member 710 may be disposed along an upper edge of the display area DA. The second sealing member 720 may be disposed along a left edge of the display area DA. The third sealing member 730 may be disposed along a lower edge of the display area DA. The fourth sealing member 440 may be disposed along a right edge of the display area DA.

The sealing member 700 may be made of a conductive material and may electrically connect a common voltage line disposed on the first substrate 110 and a common electrode disposed on the second substrate 120. Accordingly, since the sealing member 700 concurrently performs the function of supplying a common voltage supplied from the first substrate 110 to the common electrode of the second substrate 120 and the function of sealing the liquid crystal layer, it is possible to omit a separate component disposed in a bezel area of the display device, thereby minimizing the bezel area. The sealing member 700 may overlap pixel areas of some pixels SP and may be insulated from a pixel electrode through the insulating member 180 shown in FIG. 23. Accordingly, the display device according to the exemplary embodiment further includes an insulator that may be in the form of an insulating member that prevents a connection between the sealing member 700 and the pixel electrode, thereby preventing the common voltage from being supplied to the pixel electrode while minimizing a size of the bezel area of the display device.

The sealing member 700 may be formed at the edge of the display area DA through a single process using an injection member. For example, a conductive sealing material may be injected between the first substrate 110 and the second substrate 120 through a single process using a syringe. Therefore, in the display device according to the exemplary embodiment, it is possible to shorten the process of forming the sealing member 700, prevent disconnection of the sealing member 700, and also prevent the sealing member 700 from being connected to the pixel electrode.

Figure 21:
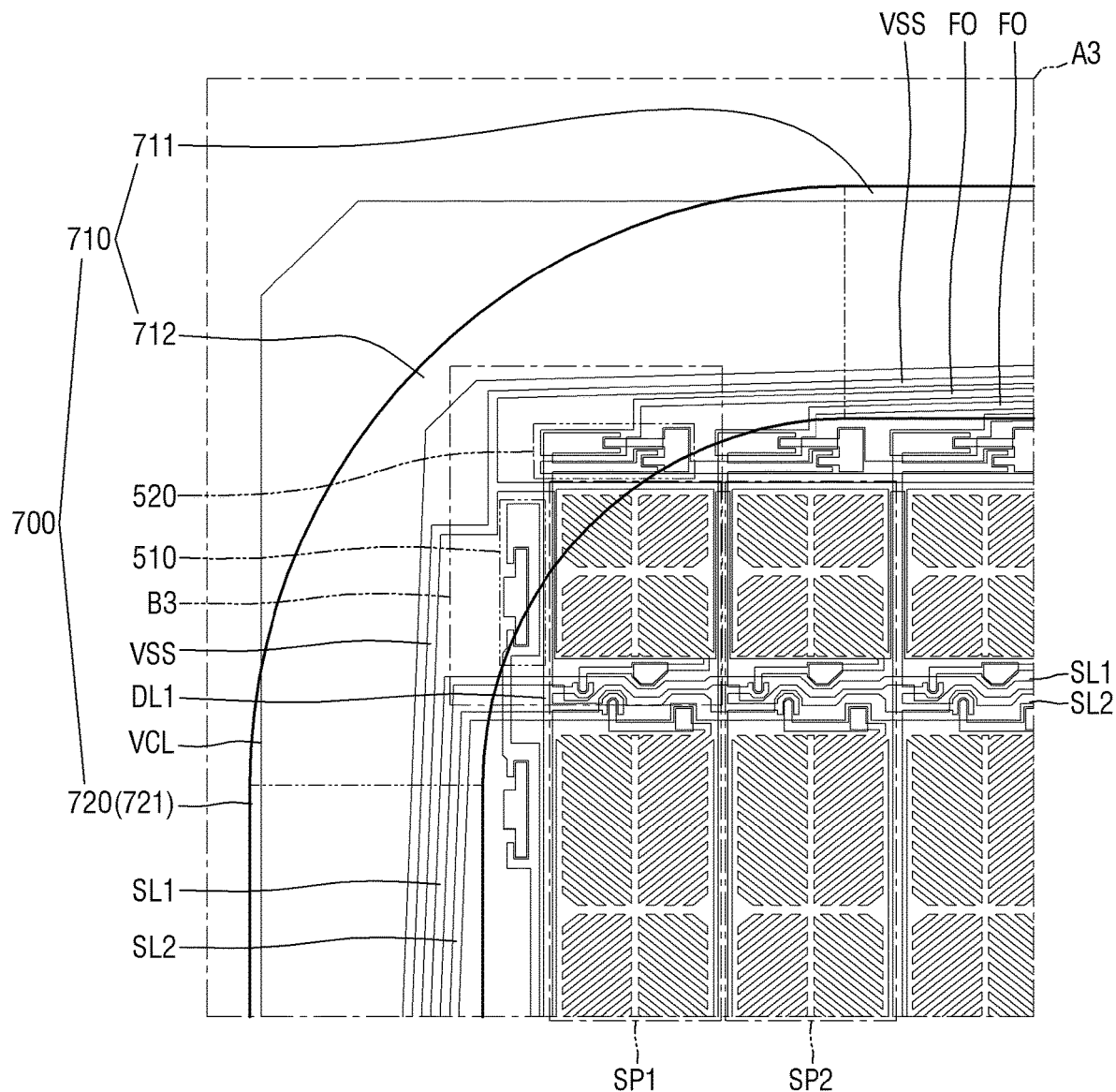
FIG. 21 is an enlarged view of a specific area A3 of FIG. 20.
Figure 22:
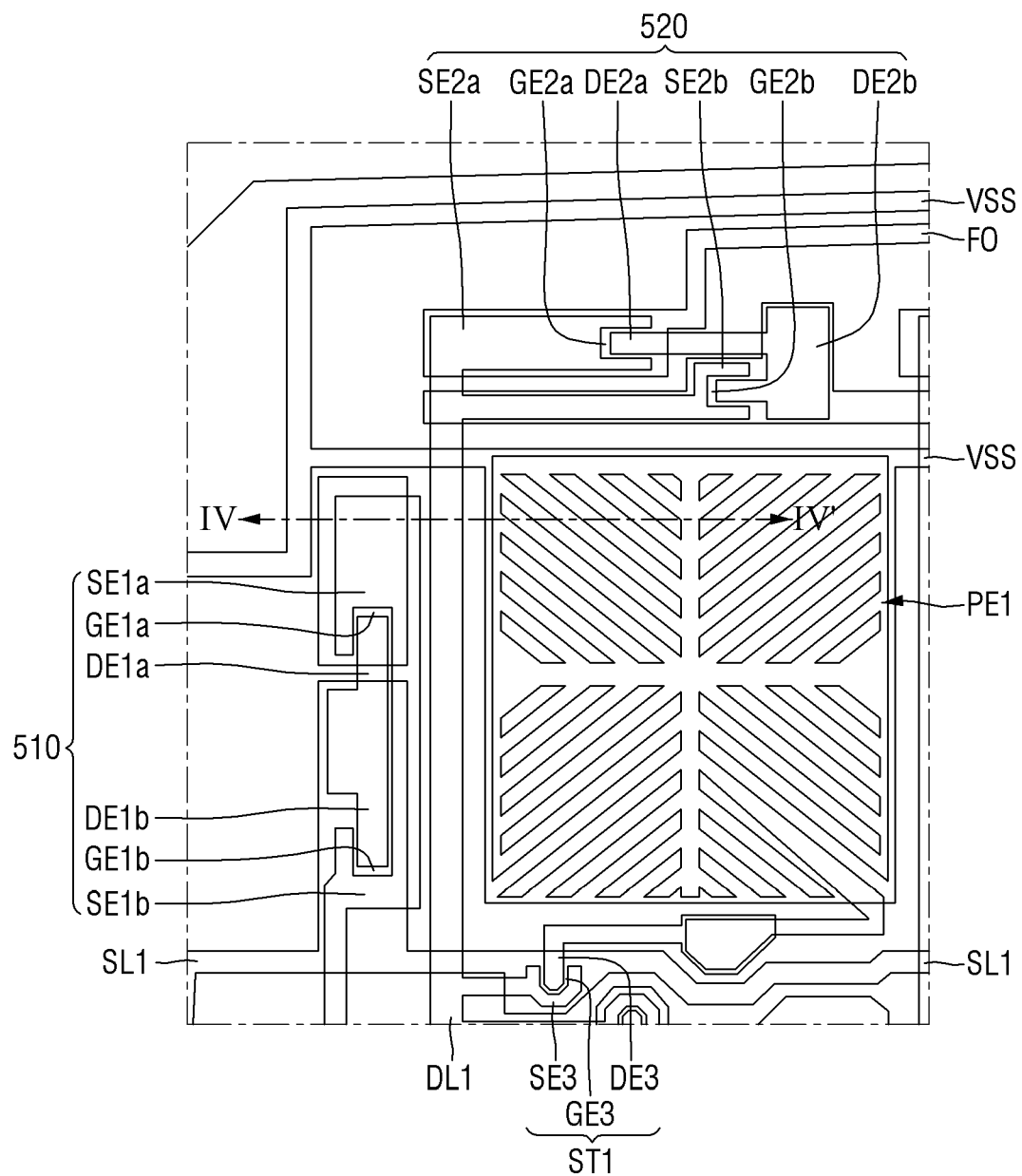
FIG. 22 is a view of a specific area B3 of FIG. 21.
Figure 23:
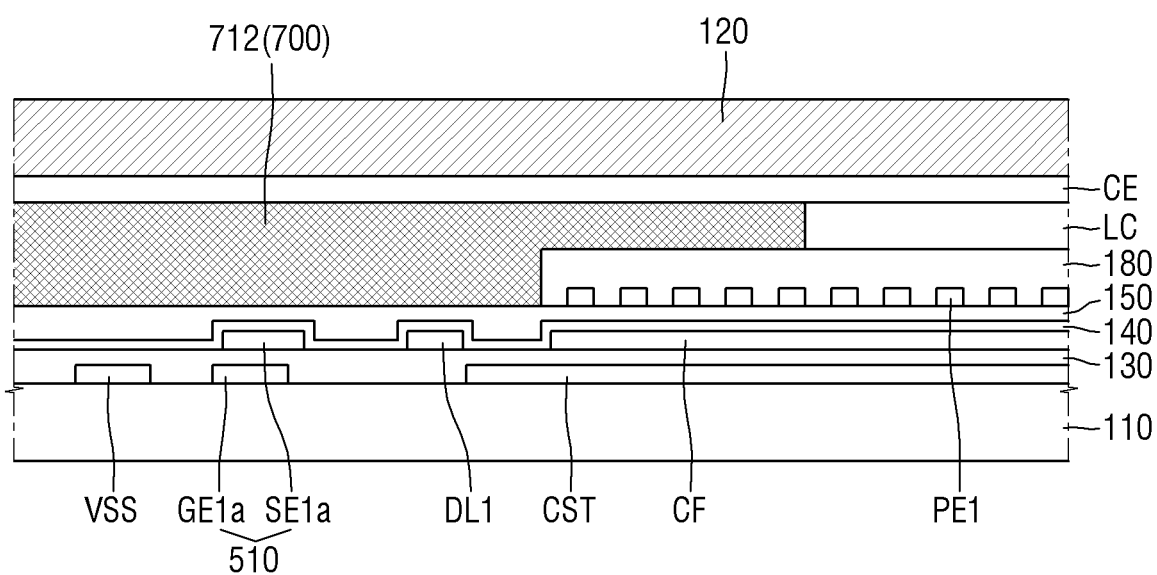
FIG. 23 is a cross-sectional view taken along line IV-IV' of FIG. 22.

FIG. 21 is an enlarged view of a specific area A3 of FIG. 21, FIG. 22 is a view of a specific area B3 of FIG. 21, and FIG. 23 is a cross-sectional view taken along line IV-IV' of FIG. 22.

Referring to FIGS. 21 to 23, the display device may include the first substrate 110, a ground line VSS, a first electrostatic discharge protection element 510, a ground electrode of a storage capacitor CST, a gate insulating film 130, a first data line DL1, a color filter CF, a protective film 140, a planarization film 150, a first pixel electrode PE1, a liquid crystal layer LC, the sealing member 700, a common electrode CE, and the second substrate 120.

The sealing member 700 may include the first to fourth sealing members 710 to 740, and the first sealing member 710 may include a straight portion 711 and a round portion 712. The straight portion 711 of the first sealing member 710 may be connected to the fourth sealing member 740 and may extend along the upper edge of the display area DA. The round portion 712 of the first sealing member 710 may be angled toward a straight portion 721 of the second sealing member 720 from the straight portion 711. The round portion 712 of the first sealing member 710 may be roundly formed to have a certain curvature.

The round portion 712 of the first sealing member 710 may overlap the first pixel electrodes PE1 of some pixels SP1 of a plurality of pixels SP. For example, in order to reduce the bezel area of the display device, the sealing member 700 may be disposed adjacent to the plurality of pixels SP, and the round portion of the sealing member 700 may have a certain curvature. The round portion of the sealing member 700 may overlap a pixel electrode of a pixel SP disposed at each of the plurality of corners of the display area DA and may not overlap pixel electrodes of pixels SP disposed in areas except for the plurality of corners.

The display device may further include an insulating member 180 shown in FIG. 23, which prevents a connection between the sealing member 700 and the first pixel electrode PE1. The insulating member 180 may cover the first pixel electrodes PE1 of some pixels SP overlapping the sealing member 700 on the planarization film 150. For example, when the insulating member 180 covers the first pixel electrode PE1 of a first pixel SP1, a portion of an upper surface of the insulating member 180 may be in contact with the sealing member 700, and the other portion of the upper surface of the insulating member 180 may be in contact with the liquid crystal layer LC.

Referring to FIG. 23, the insulating member 180 may cover the first pixel electrodes PE1 of some pixels SP overlapping the sealing member 700 and may not cover pixel electrodes of the other pixels SP not overlapping the sealing member 700. For example, the round portion 712 of the first sealing member 710 may overlap a pixel area of the first pixel SP1 disposed at an upper left corner of the display area DA and may not overlap a pixel area of a second pixel SP2 adjacent to a right side of the first pixel SP1. The insulating member 180 may cover the first pixel electrode PE1 of the first pixel SP1 and may not cover a pixel electrode of the second pixel SP2. Therefore, the insulating member 180 may prevent the first pixel electrode PE1 of the first pixel SP1 from being connected to the sealing member 700.

Therefore, the display device according to the exemplary embodiment may further include the insulating member 180, which prevents a connection between the sealing member 700 and the first pixel electrode PE1, thereby preventing connection between the sealing member 700 and the first pixel electrode PE1 without reducing a size of the first pixel electrode PE1.

In a display device according to exemplary embodiments, since a sealing member surrounding a liquid crystal layer is made of a conductive material, a common voltage supplied from a common voltage line on a first substrate can be supplied to a common electrode on a second substrate. The sealing member can include a straight portion disposed parallel to an edge of a display area and a protrusion portion angled toward a non-display area from the straight portion. Therefore, the sealing member is not connected to a pixel electrode of a pixel, thereby preventing the common voltage from being supplied to the pixel electrode while minimizing a size of a bezel area.

In a display device according to exemplary embodiments, pixel areas of some pixels of a plurality of pixels can overlap a sealing member. In order to prevent a connection between the sealing member and a pixel electrode, a size of the pixel electrode of the pixel overlapping the sealing member can be reduced. The size of the pixel electrode of the pixel overlapping the sealing member can be smaller than a size of a pixel electrode of a pixel not overlapping the sealing member. Therefore, the sealing member is not connected to the pixel electrode of the pixel, thereby preventing the common voltage from being supplied to the pixel electrode while minimizing a size of a bezel area.

In a display device according to exemplary embodiments, an insulating member can cover pixel electrodes of some pixels overlapping a sealing member among a plurality of pixels. The insulating member can be disposed between the pixel electrode and the sealing member overlapping each other, thereby preventing the pixel electrode from being connected to the sealing member. Therefore, the sealing member is not connected to the pixel electrode of the pixel, thereby preventing a common voltage from being supplied to the pixel electrode while minimizing a size of a bezel area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate including a display area and a non-display area;
   a second substrate opposing the first substrate;
   a liquid crystal layer disposed between the first substrate and the second substrate to overlap the display area; and
   a seal made of conductive material disposed between the first substrate and the second substrate to surround the liquid crystal layer,
   wherein at least one corner of the seal projects toward the non-display area, and
   wherein the seal comprises:
   a first sealing member disposed at a first edge of one side of the display area; and
   a second sealing member disposed at a second edge of another side of the display area substantially perpendicular to the one side of the display area,
   wherein each of the first sealing member and the second sealing member includes a substantially straight portion and a protrusion portion angled from the substantially straight portion toward the non-display area,
   wherein the protrusion portion of the first sealing member is directly connected with the second sealing member, and
   wherein the first sealing member and the second sealing member are electrically connected to each other.

2. The display device of claim 1, further comprising a plurality of pixels disposed on the first substrate, the plurality of pixels comprising pixel electrodes,
   wherein a distance between the protrusion portion and the pixel electrodes is greater than a distance between one of the substantially straight portions and the pixel electrodes.

3. The display device of claim 1, further comprising a plurality of pixels disposed on the first substrate, the plurality of pixels comprising pixel electrodes,
   wherein the seal does not overlap the pixel electrodes.

4. The display device of claim 1, wherein the protrusion portion of the first sealing member is disposed between the substantially straight portion of the first sealing member and the substantially straight portion of the second sealing member.

5. The display device of claim 1, further comprising a common electrode disposed on the second substrate to face a pixel electrode,
   wherein the seal is in contact with the common electrode.

6. The display device of claim 1, further comprising a common voltage line disposed on at least one edge of the display area on the first substrate,
   wherein the common voltage line overlaps the sealing member.

* * * * *